(12) United States Patent
Huang et al.

(10) Patent No.: US 11,367,789 B2
(45) Date of Patent: Jun. 21, 2022

(54) SOURCE/DRAIN RECESS ETCH STOP LAYERS AND BOTTOM WIDE-GAP CAP FOR III-V MOSFETS

(71) Applicant: Intel Corporation, Santa Clara, CA (US)

(72) Inventors: Cheng-Ying Huang, Portland, OR (US); Willy Rachmady, Beaverton, OR (US); Matthew V. Metz, Portland, OR (US); Gilbert Dewey, Beaverton, OR (US); Jack T. Kavalieros, Portland, OR (US); Sean T. Ma, Portland, OR (US); Harold Kennel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/316,337

(22) PCT Filed: Sep. 26, 2016

(86) PCT No.: PCT/US2016/053831
§ 371 (c)(1),
(2) Date: Jan. 8, 2019

(87) PCT Pub. No.: WO2018/057043
PCT Pub. Date: Mar. 29, 2018

(65) Prior Publication Data
US 2019/0296145 A1   Sep. 26, 2019

(51) Int. Cl.
*H01L 29/78* (2006.01)
*H01L 21/02* (2006.01)
(Continued)

(52) U.S. Cl.
CPC ............ *H01L 29/785* (2013.01); *B82Y 10/00* (2013.01); *H01L 21/02104* (2013.01);
(Continued)

(58) Field of Classification Search
CPC ............. H01L 29/785; H01L 29/78696; H01L 29/778; H01L 29/1079; H01L 29/775;
(Continued)

(56) References Cited

U.S. PATENT DOCUMENTS 8,501,508 B2 * 8/2013 Majhi .................. H01L 29/152
438/22
9,530,860 B2 * 12/2016 Kerber ................ H01L 29/6659
(Continued)

FOREIGN PATENT DOCUMENTS

TW     201528511     7/2015

OTHER PUBLICATIONS

International Search Report and Written Opinion for International Patent Application No. PCT/US2016/053831 dated Jun. 7, 2017, 13 pgs.
(Continued)

*Primary Examiner* — Shouxiang Hu
(74) *Attorney, Agent, or Firm* — Schwabe, Williamson & Wyatt, P.C.

(57) ABSTRACT

A buffer layer is deposited on a substrate. A first III-V semiconductor layer is deposited on the buffer layer. A second III-V semiconductor layer is deposited on the first III-V semiconductor layer. The second III-V semiconductor layer comprises a channel portion and a source/drain portion. The first III-V semiconductor layer acts as an etch stop layer to etch a portion of the second III-V semiconductor layer to form the source/drain portion.

17 Claims, 16 Drawing Sheets

(51) Int. Cl.
*H01L 29/20* (2006.01)
*H01L 29/417* (2006.01)
*H01L 29/66* (2006.01)
*H01L 29/786* (2006.01)
*H01L 29/778* (2006.01)
*H01L 29/10* (2006.01)
*H01L 29/775* (2006.01)
*H01L 29/06* (2006.01)
*H01L 29/423* (2006.01)
*B82Y 10/00* (2011.01)

(52) U.S. Cl.
CPC ...... *H01L 29/0673* (2013.01); *H01L 29/1054* (2013.01); *H01L 29/1079* (2013.01); *H01L 29/20* (2013.01); *H01L 29/41791* (2013.01); *H01L 29/42392* (2013.01); *H01L 29/66469* (2013.01); *H01L 29/66742* (2013.01); *H01L 29/66795* (2013.01); *H01L 29/775* (2013.01); *H01L 29/778* (2013.01); *H01L 29/78618* (2013.01); *H01L 29/78681* (2013.01); *H01L 29/78696* (2013.01)

(58) Field of Classification Search
CPC ........... H01L 29/78618; H01L 29/0673; H01L 29/42392; H01L 29/66469; H01L 29/78681; H01L 29/1054; H01L 29/66742; H01L 21/02104; H01L 29/20; H01L 29/41791; H01L 29/66795; H01L 29/66545; H01L 29/7848; H01L 29/66522; H01L 27/0924; H01L 21/823821; B82Y 10/00
See application file for complete search history.

(56) References Cited

U.S. PATENT DOCUMENTS

| | | | |
|---|---|---|---|
| 2006/0172497 A1* | 8/2006 | Hareland | H01L 29/66772 438/286 |
| 2014/0264592 A1 | 9/2014 | Oxland et al. | |
| 2014/0264607 A1 | 9/2014 | Basu et al. | |
| 2015/0318282 A1* | 11/2015 | Rodder | H01L 21/823431 257/392 |
| 2016/0204245 A1 | 7/2016 | Jangjian et al. | |
| 2016/0211261 A1* | 7/2016 | Liu | H01L 29/267 |
| 2016/0365416 A1* | 12/2016 | Metz | H01L 21/02502 |

OTHER PUBLICATIONS

Office Action from Taiwan Patent Application No. 106128296, dated Dec. 7, 2020, 21 pgs.
Office Action from Taiwan Patent Application No. 106128296, dated Jul. 15, 2021, 18 pgs.
International Preliminary Report on Patentability for International Patent Application No. PCT/US2016/053831, dated Apr. 4, 2019, 10 pgs.
Office Action from Taiwan Patent Application No. 106128296, dated Feb. 21, 2022, 5 pgs.

* cited by examiner

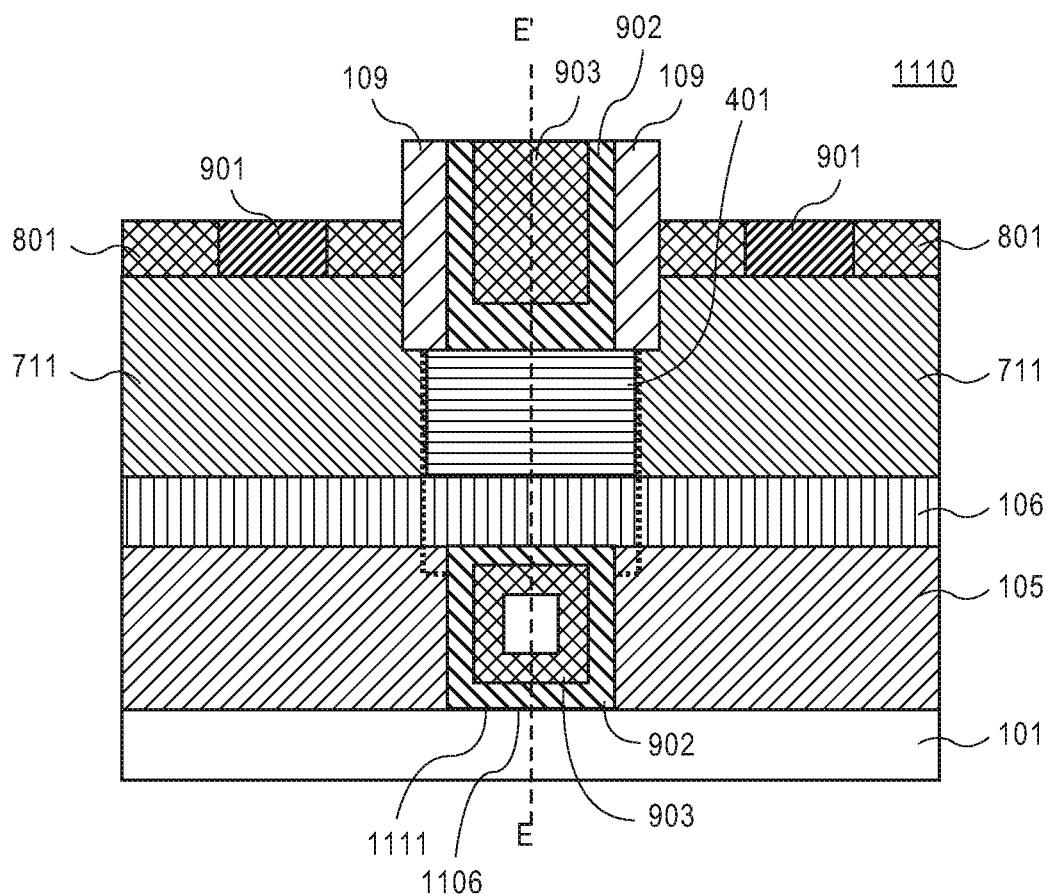
FIG. 11B
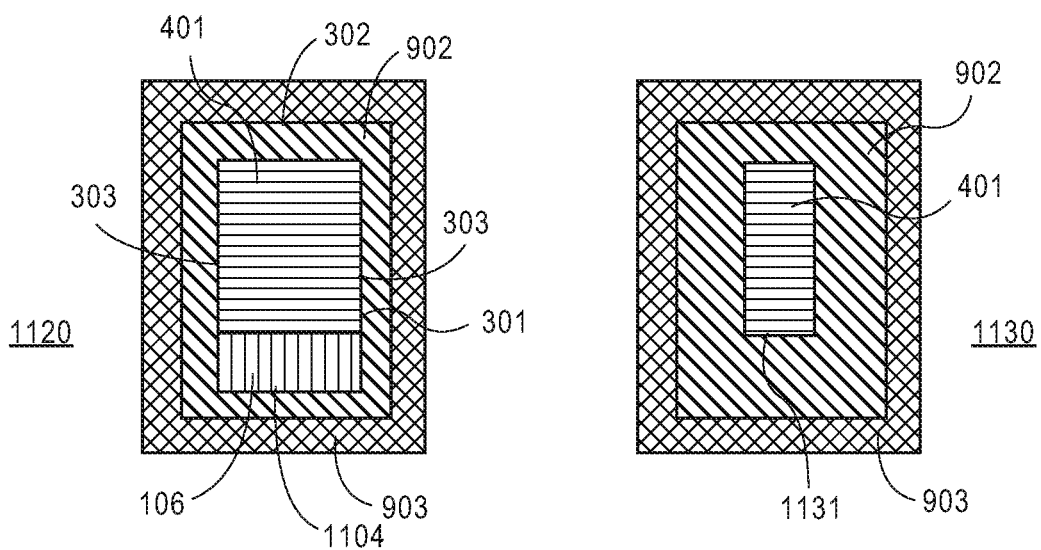
FIG. 11C  FIG. 11D

US 11,367,789 B2

SOURCE/DRAIN RECESS ETCH STOP LAYERS AND BOTTOM WIDE-GAP CAP FOR III-V MOSFETS

CROSS-REFERENCE TO RELATED APPLICATION

This patent application is a U.S. National Phase Application under 35 U.S.C. § 371 of International Application No. PCT/US2016/053831, filed Sep. 26, 2016, entitled "SOURCE/DRAIN RECESS ETCH STOP LAYERS AND BOTTOM WIDE-GAP CAP FOR III-V MOSFETS," which designates the United States of America, the entire disclosure of which is hereby incorporated by reference in its entirety and for all purposes.

FIELD

Embodiments as described herein relate to a field of electronic device manufacturing, and in particular, to manufacturing III-V material based electronic devices.

BACKGROUND

Generally, III-V materials have higher electron mobility relative to conventional silicon. III-V materials can be used for high performance electronic devices in integrated circuit manufacturing. The III-V material based devices may be used for system-on-chips ("SoCs") applications, for example, for power management integrated circuits ("ICs") and radio frequency ("RF")-power amplifiers. The III-V material based transistors may be used for high voltage and high frequency applications.

Typically, fin-based transistors are used to improve electrostatic control over the channel, reduce the leakage current and overcome other short-channel effects comparing with planar transistors. Deposition of the III-V material fin on a silicon substrate however is a great challenge due to dissimilar properties of the III-V material and silicon. A large lattice mismatch between the III-V material and silicon results in high defect densities in the III-V material grown on Si.

Typically, to fabricate a III-V transistor an InGaAs channel layer is grown in trenches in silicon dioxide on the silicon substrate using an aspect ratio trapping (ART) technique. Generally, the ART refers to a technique that causes the defects to terminate at the silicon dioxide sidewalls of the trenches. Typically, a GaAs buffer layer is grown directly on a silicon substrate and the InGaAs channel layer is grown on the GaAs buffer layer. The system having the InGaAs channel layer grown on GaAs buffer layer on the silicon substrate, however, has a lot of defects due to a large lattice mismatch between the GaAs buffer layer and InGaAs layer. These defects significantly reduce the mobility of carriers (e.g., electrons, holes, or both) in the III-V material and degrade transistor performance. Additionally, the InGaAs channel layer on the GaAs buffer layer has poor etch selectivity so that etching of the source/drain recesses and the fin release process are difficult to control.

BRIEF DESCRIPTION OF THE DRAWINGS

Embodiments of the invention may be best understood by referring to the following description and accompanying drawings that are used to illustrate embodiments of the invention.

In the drawings:

FIG. 11B illustrates an embodiment having the source/drain regions extending slightly beneath the spacers.

FIG. 11C is a cross-sectional view of a portion of the electronic device structure along an axis E-E' depicted in FIG. 11B according to one embodiment.

FIG. 11D is a gate cut view illustrating a portion of an electronic device structure similar to FIG. 11A after removing a portion of the semiconductor layer underneath the channel portion of the semiconductor layer and after depositing a gate electrode layer on a gate dielectric layer according to one embodiment.

DETAILED DESCRIPTION

Figure 1:
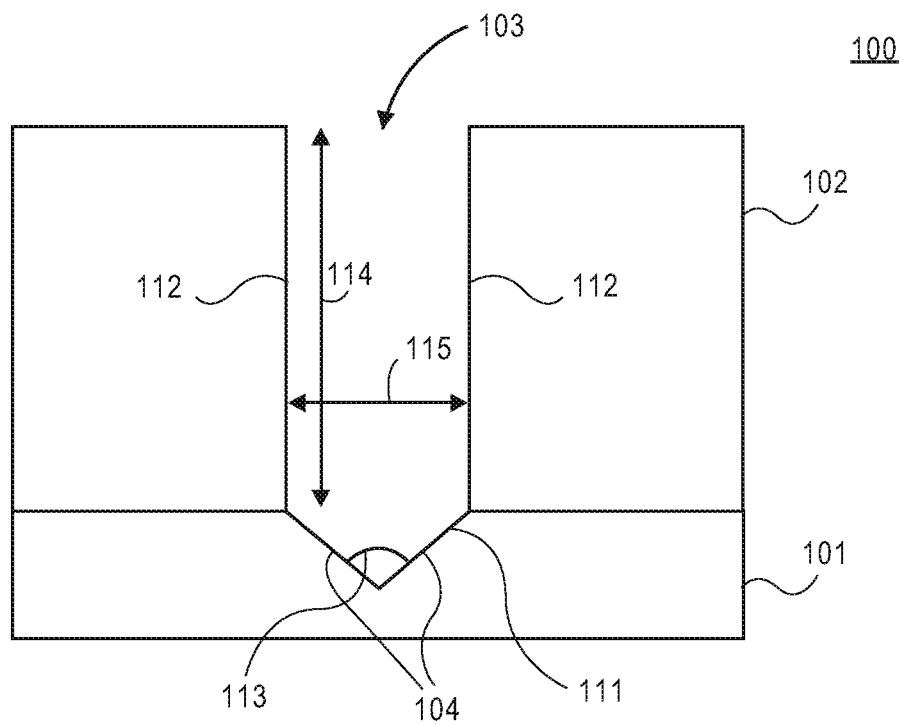
FIG. 1 is a view illustrating an electronic device structure according to one embodiment.

Methods and apparatuses to provide source/drain recess etch stop layers and bottom wide-gap capping layer for III-V metal oxide semiconductor field effect transistors (MOSFETs) are described. In one embodiment, a buffer layer is deposited on a substrate. A first III-V semiconductor layer is deposited on the buffer layer. A second III-V semiconductor layer is deposited on the first III-V semiconductor layer. The second. III-V semiconductor layer comprises a channel portion and a source/drain portion. The first III-V semiconductor layer acts as an etch stop layer to etch a portion of the second III-V semiconductor layer to form the source/drain portion.

Typically, forming source/drain regions of the transistor device involves etching recesses in a III-V semiconductor device layer and depositing a heavily doped III-V semiconductor material in the recesses. In one embodiment, depositing the second III-V semiconductor layer on the first III-V semiconductor layer on the buffer layer, wherein the first III-V semiconductor layer acts as an etch stop layer to etch a portion of the second III-V semiconductor layer provides an accurate control of etching of the source/drain recesses and the fin release process comparing to conventional techniques, as described in further detail below.

In one embodiment, depositing the second III-V semiconductor layer on the first semiconductor layer on the buffer layer, wherein the first III-V semiconductor layer acts as an etch stop layer and has a bandgap greater than that of the first III-V semiconductor layer mitigates a band to band tunneling (BTBT) that reduces the leakage current for a gate all around transistor device, as described in further detail below. In one embodiment, depositing the second III-V semiconductor layer on the first III-V semiconductor layer on the buffer layer, wherein the first III-V semiconductor layer acts as an etch stop layer increases the depth of the source/drain recesses that reduces a parasitic source/drain resistance comparing to conventional devices, as described in further detail below.

In one embodiment, as the InP and InGaAs have superior wet etch selectivity, depositing an InP bottom capping layer beneath an InGaAs channel layer on a GaAs buffer layer have several benefits that include increasing control over forming source/drain recesses; mitigating the BTBT tunneling when the III-V fin is released; decreasing the lattice mismatch between the GaAs buffer layer the InGaAs channel that enables higher crystalline quality of the InGaAs channel and reduces the defects density. Additionally, the InP bottom channel cap can be easily removed, if desired, as described in further detail below.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

FIG. 1 is a view 100 illustrating an electronic device structure according to one embodiment. An insulating layer 102 is deposited on a substrate 101, as shown in FIG. 1.

A trench 103 is formed in the insulating layer 102. In at least some embodiments, trench 103 represents one of a plurality of trenches that are formed on substrate 101. As shown in FIG. 1, trench 103 has a bottom 111 that is an exposed portion of the substrate 101 and opposing sidewalls 112. As shown in FIG. 1, the bottom portion 111 of the trench 103 has a V-shape. In one embodiment, the bottom portion 111 comprises slanted sidewalls 104 that meet at an angle 113.

In an embodiment, the bottom portion 111 is formed by etching the exposed portion of the substrate 101 aligned along a (100) crystallographic plane (e.g., Si (100)). In one embodiment, the etch process etches the portions of the substrate aligned along a (100) crystallographic plane (e.g., Si (100)) fast and slows down at the portions of the substrate aligned along (111) crystallographic planes (e.g., Si (111)). In one embodiment, the etch process stops when the portions of Si (111) are met that results in a V-shaped bottom portion 111.

Trench 103 has a depth D 114 and a width W 115. In one embodiment, depth 114 is determined by the thickness of the insulating layer 102. In an embodiment, the width of the trench is determined by the width of the electronic device. In at least some embodiments, the electronic device has a fin based transistor architecture (e.g., FinFET, Trigate, GAA, a nanowire based device, a nanoribbons based device, or any other electronic device architecture). In one embodiment, the width of the trench 103 is from about 5 nanometers (nm) to about 300 nm. In an embodiment, the aspect ratio of the trench (D/W) is at least 1.5.

In an embodiment, the substrate 101 comprises a semiconductor material. In one embodiment, substrate 101 is a monocrystalline semiconductor substrate. In another embodiment, substrate 101 is a polycrystalline semiconductor substrate. In yet another embodiment, substrate 101 is an amorphous semiconductor substrate. In an embodiment, substrate 101 is a semiconductor-on-isolator (SOI) substrate including a bulk lower substrate, a middle insulation layer, and a top monocrystalline layer. The top monocrystalline layer may comprise any semiconductor material.

In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In another embodiment, substrate 101 comprises a III-V material. Generally, the III-V material refers to a compound semiconductor material that comprises at least one of group III elements of the periodic table, e.g., boron ("B"), aluminum ("Al"), gallium ("Ga"), indium ("In"), and at least one of group V elements of the periodic table, e.g., nitrogen ("N"), phosphorus ("P"), arsenic ("As"), antimony ("Sb"), bismuth ("Bi"). In an embodiment, substrate 101 comprises InP, GaAs, InGaAs, InAlAs, other III-V material, or any combination thereof.

In alternative embodiments, substrate 101 includes a group IV material layer. Generally, the group IV material refers to a semiconductor material comprising one or more elements of the group IV of the periodic table, e.g., carbon (C), silicon (Si), germanium (Ge), tin (Sn), lead (Pb), or any combination thereof. In one embodiment, substrate 101 comprises a silicon layer, a germanium layer, a silicon germanium (SiGe) layer, or any combination thereof.

In one embodiment, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate includes one or more buffer layers to accommodate for a lattice mismatch between the substrate 101 and one or more layers above substrate 101 and to confine lattice dislocations and defects.

Insulating layer 102 can be any material suitable to insulate adjacent devices and prevent leakage. In one embodiment, electrically insulating layer 102 is an oxide layer, e.g., silicon dioxide, or any other electrically insulating layer determined by an electronic device design. In one embodiment, insulating layer 102 comprises an interlayer dielectric (ILD). In one embodiment, insulating layer 102 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, insulating layer 102 includes a dielectric material having k-value less than 5. In one embodiment, insulating layer 102 includes a dielectric material having k-value less than 2. In at least some embodiments, insulating layer 102 includes a nitride, oxide, a polymer, phosphosilicate glass, fluorosilicate (SiOF) glass, organosilicate glass (SiOCH), other electrically insulating layer determined by an electronic device design, or any combination thereof in one embodiment, insulating layer 102 is a shallow trench isolation (STI) layer to provide field isolation regions that isolate one fin from other fins on substrate 101. In one embodiment, the thickness of the insulating layer 102 is at least 10 nm. In one non-limiting example, the thickness of the layer is in an approximate range from about 10 nm to about 2 microns (μm).

In an embodiment, the insulating layer is deposited on the substrate using one or more of the deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing. In one embodiment, trench 103 is formed in the insulating layer 102 using one or more patterning and etching techniques known to one of ordinary skill in the art of microelectronic device manufacturing.

Figure 2:
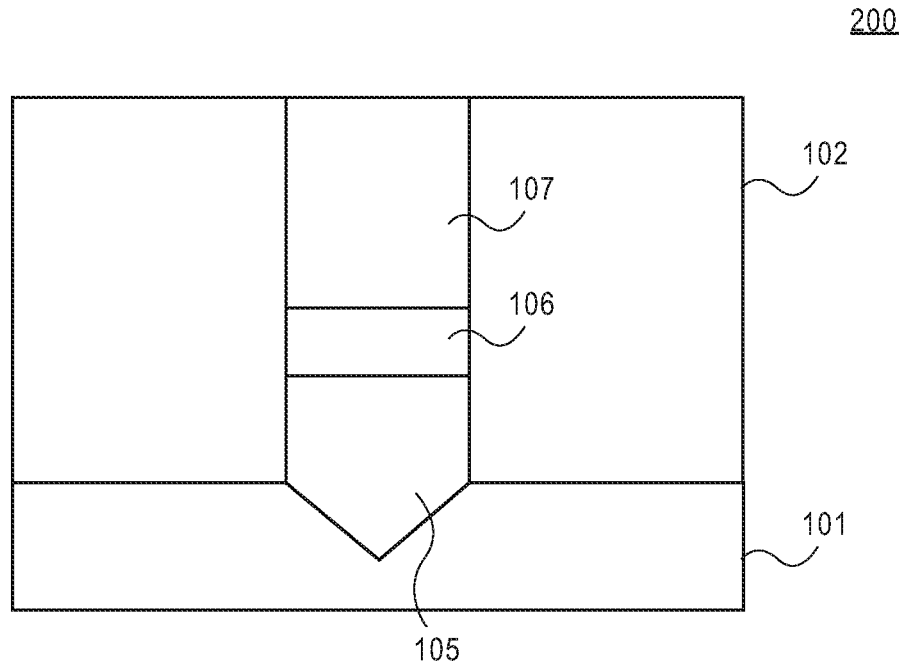
FIG. 2 is a view similar to Figure I after a semiconductor layer is deposited on a semiconductor layer on a buffer layer on the portion of the substrate within the trench according to one embodiment.

FIG. 2 is a view 200 similar to FIG. 1 after a semiconductor layer 107 is deposited on a semiconductor layer 106 on a buffer layer 105 on the portion of the substrate 101 within the trench 103 according to one embodiment. Buffer layer 105 is deposited onto bottom 111 between sidewalls 112 of the trench 103, as shown in FIG. 2. The buffer layer 105 is deposited to accommodate for a lattice mismatch between the substrate 101 and one or more layers above the buffer layer 105 and to confine lattice dislocations and defects.

In an embodiment, buffer layer 105 has a lattice parameter between the lattice parameter of the substrate 101 and semiconductor layer 106. Generally, a lattice constant is a lattice parameter that is typically referred as a distance between unit cells in a crystal lattice. Lattice parameter is a measure of the structural compatibility between different materials. In one embodiment, the buffer layer 105 has a graded bandgap that gradually changes from the interface with the substrate 101 to the interface with the subfin layer. In various embodiments the buffer layer 105 may have different numbers of layers or simply be a single layer. As shown in FIG. 2, semiconductor layer 106 is deposited onto the top surface of the buffer layer 105 between sidewalls 112 of the trench 103. In at least some embodiments, the buffer layer 105 is not deposited into the trench 103, and semiconductor layer 106 is deposited directly onto the bottom III of the trench 103.

In one embodiment, an aspect ratio D/W of the trench 103 determines the thickness of the buffer layer 105. In an embodiment, the thickness of the buffer layer 105 is such that defects originated from the lattice mismatch are trapped within the buffer layer and are prevented from being propagated into the semiconductor layer 106 using an aspect ratio trapping (ART).

In one embodiment, buffer layer 105 has the sufficient thickness that most defects present at the bottom 111 do not reach the top surface of the buffer layer 105. In one embodiment, the thickness of the buffer layer 105 is at least about 5 nm. In one embodiment, the thickness of the buffer layer 105 is from about 5 nm to about 500 nm.

In one embodiment, the buffer layer 105 comprises a III-V material layer. In an embodiment, substrate 101 is a silicon substrate, and buffer layer 105 comprises a III-V material layer, e.g., GaAs, InGaAs, InAs, InAlAs, other III-V material, or any combination thereof.

In one embodiment, each of the semiconductor layers 106 and 107 is a III-V semiconductor layer. In one embodiment, semiconductor layer 107 is deposited to form a channel portion and source/drain portions later on in a process, as described in further detail below. In one embodiment, semiconductor layer 106 is an etch stop layer to selectively etch a portion of the semiconductor layer 107 to form the source/drain recesses. In one embodiment, the semiconductor layer 106 has a bandgap that is greater than a bandgap of the semiconductor layer 107. In one embodiment, the bandgap of the semiconductor layer 106 is about 1.35 electron volts (eV) and the bandgap of the semiconductor layer 107 is about 0.7 eV.

In one embodiment, the III-V semiconductor layer 106 comprises a group V material that is different from a group V material of the III-V semiconductor layer 107. For example, semiconductor layer 107 is a III-As semiconductor layer, and semiconductor layer 106 is a III-P semiconductor layer. In one embodiment, the III-V semiconductor layer 106 comprises indium phosphide (InP), gallium phosphide (GaP), indium gallium phosphide (InGaP) or any combination thereof. In one embodiment, the III-V semiconductor layer 107 comprises indium gallium arsenide (InGaAs), indium arsenide (InAs), indium antimonide (InSb), indium gallium antimonide (InGaSb), or any combination thereof. In one embodiment, semiconductor layer 107 is an InGaAs layer, semiconductor layer 106 is an InP layer and buffer layer 105 is a GaAs layer. In one embodiment, semiconductor layer 107 is an In0.53Ga0.47As layer. In one embodiment, the semiconductor layer 107 and the semiconductor layer 106 have substantially matching lattice constants and have not greater than about 4% lattice mismatch to the buffer layer 105 to reduce the defect density in the channel portion of the semiconductor layer 107.

In one embodiment, the thickness of the semiconductor layer 106 is from about 2 nanometers (nm) to about 20 nm. In at least some embodiments, the semiconductor layer 107 on the semiconductor layer 106 is a part of a fin, as described in further detail below.

In at least some embodiments, buffer layer 105 is deposited through trench 103 onto the exposed portion of substrate 101 using one or more of epitaxial techniques known to one of ordinary skill in the art of microelectronic device manufacturing, such as but not limited to a CVD, a PVD, an MBE, an MOCVD, an ALD, spin-on, or other epitaxial growth technique. In at least some embodiments, semiconductor layer 106 is deposited onto the buffer layer 105 using one or more of epitaxial techniques known to one of ordinary skill in the art of microelectronic device manufacturing, such as but not limited to a CVD, a PVD, an MBE, an MOCVD, an ALD, spin-on, or other epitaxial growth technique. In at least some embodiments, semiconductor layer 107 is deposited on the semiconductor layer 106 using one or more of epitaxial techniques known to one of ordinary skill in the art of microelectronic device manufacturing, such as but not limited to a CVD, a PVD, an MBE, an MOCVD, an ALD, spin-on, or other epitaxial growth technique.

Figure 3:
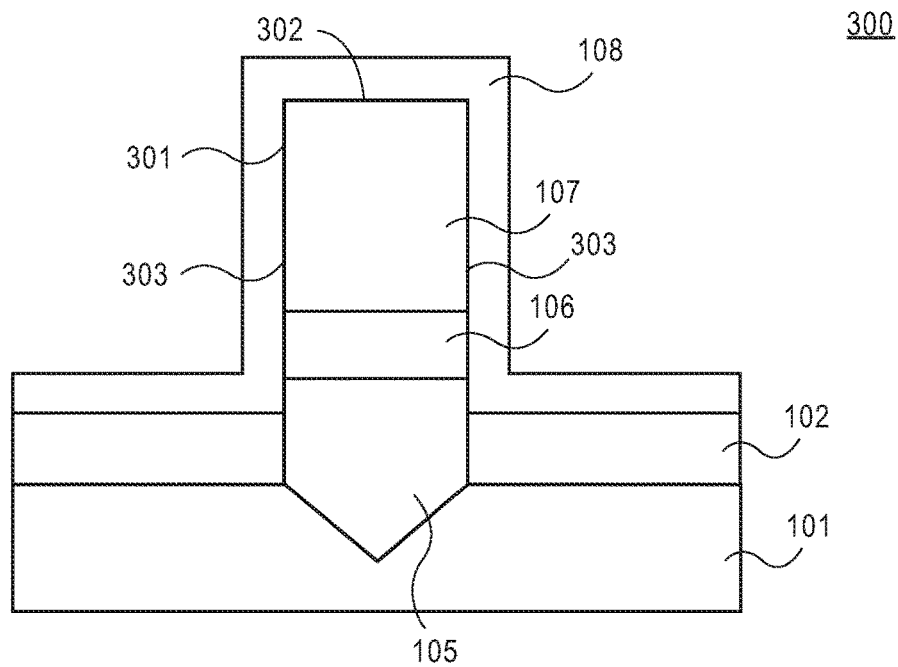
FIG. 3 is a view similar to FIG. 2 after the insulating layer is recessed to form a fin and a sacrificial layer is deposited on the fin according to one embodiment.
Figure 4:
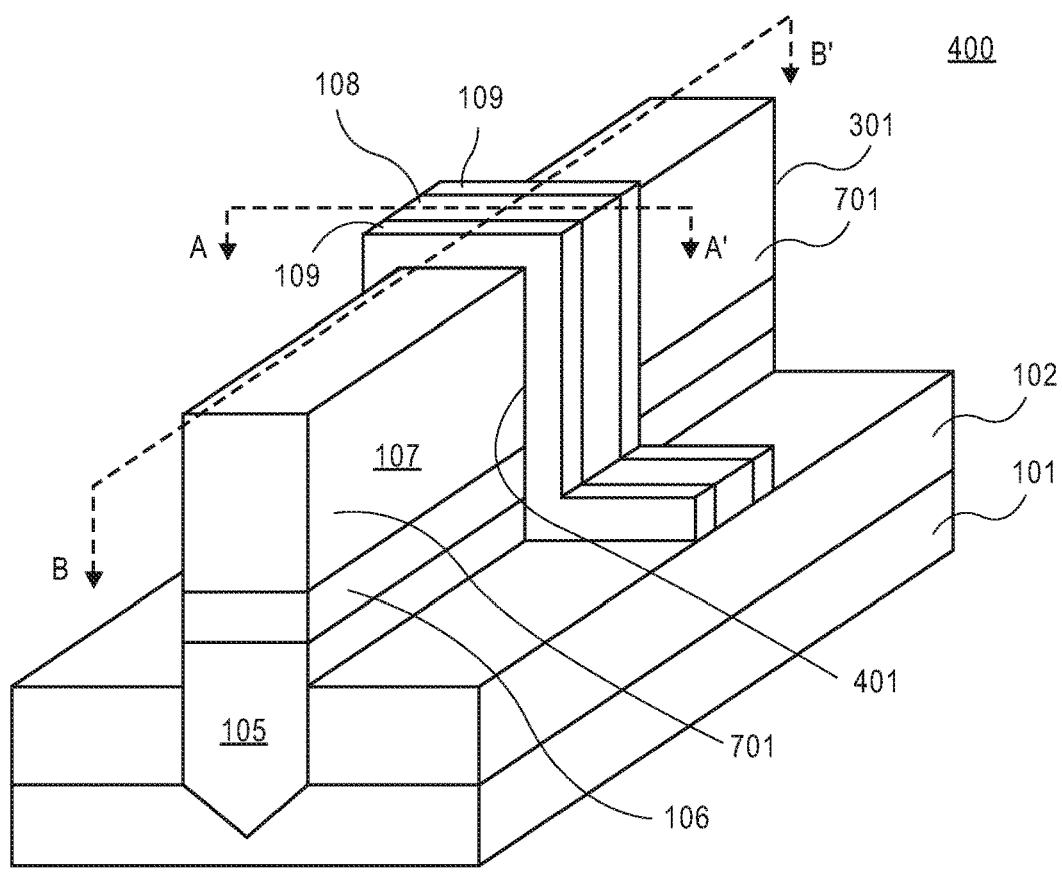
FIG. 4 is a perspective view illustrating the electronic device structure depicted in FIG. 3 according to one embodiment.
Figure 5:
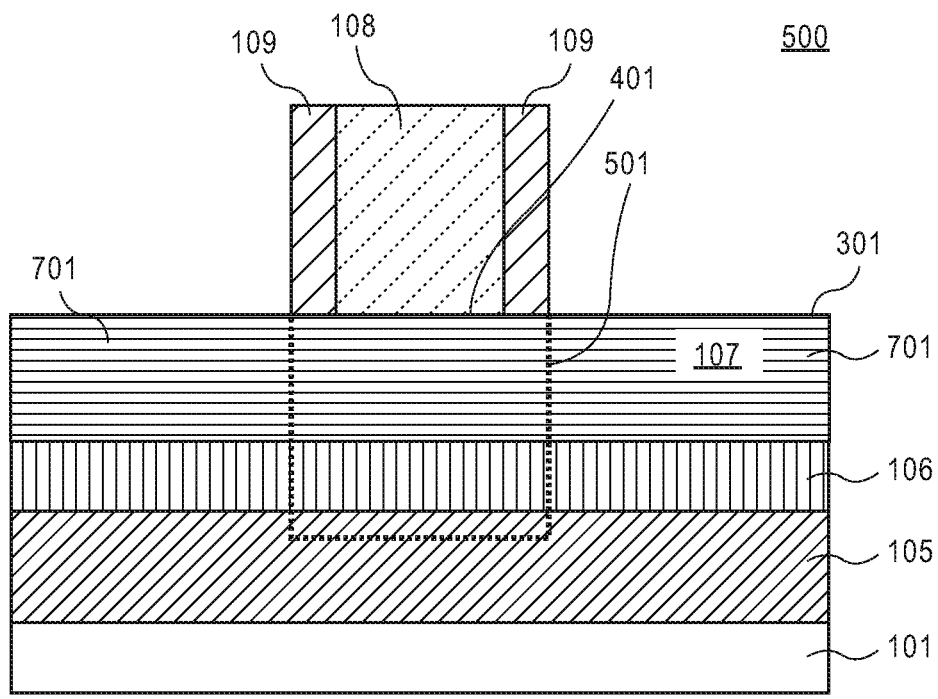
FIG. 5 is a cross-sectional view of the electronic device structure depicted in FIG. 4 along an axis B-B' according to one embodiment.

FIG. 3 is a view 300 similar to FIG. 2 after the insulating layer 102 is recessed to form a fin 301 and a sacrificial layer 108 is deposited on the fin according to one embodiment. FIG. 4 is a perspective view 400 illustrating the electronic device structure depicted in FIG. 3 according to one embodiment. View 300 is a cross-sectional view of the electronic device structure shown in FIG. 4 along an axis A-A' ("gate cut view") according to one embodiment. FIG. 5 is a cross-sectional view 500 of the electronic device structure depicted in FIG. 4 along an axis B-B' (source-drain cut view) according to one embodiment.

As shown in FIGS. 3, 4 and 5, fin 301 comprises a top portion 302 and opposing sidewalls 303. As shown in FIGS. 3 and 4, fin 301 comprises a portion of the semiconductor layer 107 on the semiconductor layer 106 on buffer layer 105 that protrudes from a top surface of the recessed insulating layer 102.

In an embodiment, the length of the fin is substantially greater than the width. As shown in FIGS. 3 and 4, insulating layer 102 is recessed down to a predetermined depth that defines the height of the fin 301 relative to a top surface of the insulating layer 102. The height and the width of the fin 301 are typically determined by a design. In an embodiment, the height of the fin 301 is from about 10 nm to about 100 nm and the width of the fin 301 is from about 3 nm to about 20 nm.

In one embodiment, forming fin 301 involves depositing a patterned hard mask (not shown) onto semiconductor layer 107 and then recessing insulating layer 102 to a predetermined depth. In one embodiment, insulating layer 102 is recessed by a selective etching technique, such as but not limited to a wet etching, a dry etching, or any combination thereof techniques using a chemistry that has substantially high selectivity to the fin material. In one embodiment, a ratio of the etching rates of the insulating layer 102 to the fin material is at least 10:1. In one embodiment, after recessing the insulating layer 102, the patterned hard mask is removed by a chemical mechanical polishing (CMP) process as known to one of ordinary skill in the art of microelectronic device manufacturing.

In another embodiment, forming the fin 301 involves depositing the semiconductor layer 107 on the semiconductor layer 106 on the buffer layer 105 on the substrate 101 using one or more of deposition techniques, such as but not limited to a CVD, a PVD, an MBE, an MOCVD, an ALD, spin-on, or other deposition techniques known to one of ordinary skill in the art of microelectronic device manufacturing. The stack comprising the semiconductor layer 107 on the semiconductor layer 106 on the buffer layer 105 is patterned and etched using one or more fin patterning and etching techniques known to one of ordinary skill in the art of microelectronic device manufacturing to form the fin 301. The insulating layer 102 is deposited to a predetermined thickness adjacent to portions of the sidewalls of the fin stack on the substrate 101.

In yet another embodiment, forming the fin 301 involves depositing the buffer layer 105 in the trench 103 and on top of the insulating layer 102. The buffer layer 105 is then polished back to be planar with the top portions of the insulating layer 102 using a chemical mechanical polishing (CMP) process as known to one of ordinary skill in the art of microelectronic device manufacturing. The semiconductor layer 106 is then selectively grown on the planarized surface of the buffer layer 105. The semiconductor layer 107 is then selectively grown on the top surface of the semiconductor layer 106. In at least some embodiments, each of the semiconductor layer 106 and semiconductor layer 107 is selectively grown using one or more selective epitaxial techniques known to one of ordinary skill in the art of microelectronic device manufacturing, such as but not limited to a CVD, a PVD, an MBE, an MOCVD, an ALD, spin-on, or other selective epitaxial growth technique.

As shown in FIGS. 3, 4 and 5, a sacrificial (dummy) gate electrode stack 108 is deposited on a channel portion 401 of the fin 301. In one embodiment, dummy gate electrode stack 108 is removed later on in a process. As shown in FIGS. 4 and 5, spacers 109 are formed on the opposite sidewalls of the gate electrode stack 108. In one embodiment, dummy gate electrode stack 108 and spacers 109 wrap around a portion of the fin 301 including channel portion 401 as indicated by a dotted line 501 depicted in FIG. 5. As shown in FIGS. 3, 4 and 5, the dummy gate electrode stack 108 is deposited on top portion 302 and opposing sidewalls 303 of the channel portion 401 of the fin 301. As shown in FIG. 5, dummy gate electrode stack 108 has a top portion and laterally opposite sidewalls separated by a distance which defines the length of channel portion 401 of the fin 301. In one embodiment, the length of the channel portion 401 is from about 5 nanometers (nm) to about 300 nm. In one embodiment, the length of the channel portion 401 is from about 10 nm to about 30 nm. In one embodiment, the dummy gate electrode stack 108 comprises a dummy gate electrode on a dummy gate dielectric (not shown). In one embodiment, the dummy gate electrode stack is a dummy gate electrode that is directly deposited on the channel portion 401 of the fin 301. In one embodiment, dummy gate electrode stack 108 is a polysilicon layer. Example dummy gate dielectric materials include silicon dioxide, and example dummy gate electrode materials include polysilicon, although any suitable dummy/sacrificial gate dielectric and/or electrode materials can be used for the gate electrode stack 108. In at least some embodiments, the dummy gate electrode stack 108 is formed using one or more of dummy gate electrode stack formation techniques known to one of ordinary skill in the art of microelectronic device manufacturing.

As shown in FIGS. 4 and 5, the semiconductor layer 107 comprises portions 701 to form source/drain regions on the areas of the fin 301 defined by the spacers 109 at opposite sides of the gate electrode stack 108. In at least some embodiments, spacers 109 are formed using one or more spacer deposition techniques known to one of ordinary skill in the microelectronic device manufacturing. In one embodiment, the spacers 109 are nitride spacers (e.g., silicon nitride), oxide spacers, carbide spacers (e.g., silicon carbide), or other spacers.

Figure 6:
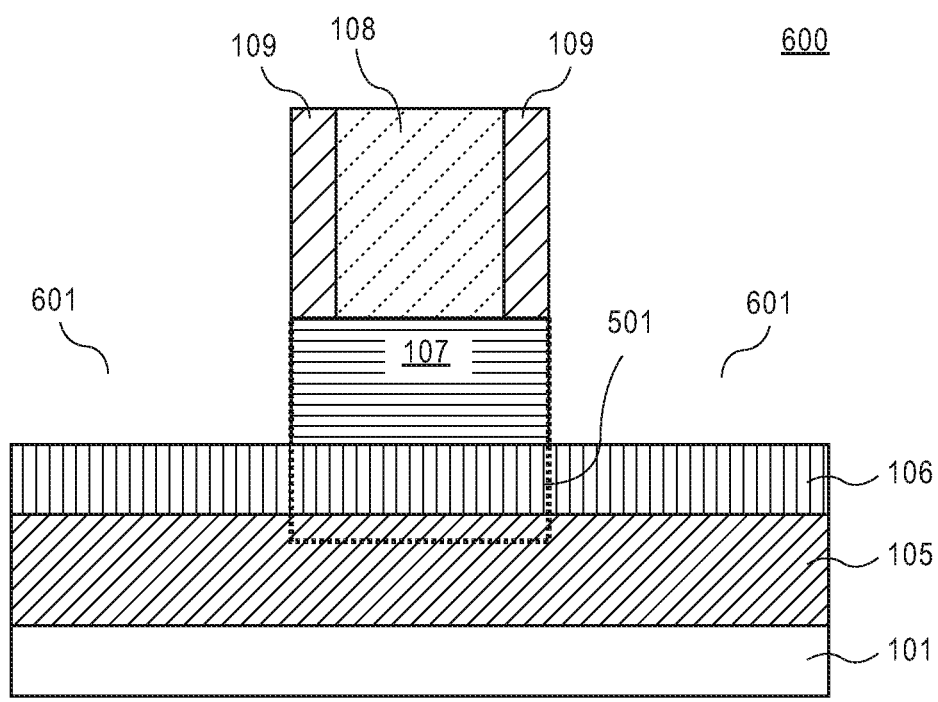
FIG. 6 is a view similar to FIG. 5, after source/drain recesses are formed in the semiconductor layer according to one embodiment.

FIG. 6 is a view 600 similar to FIG. 5, after source/drain recesses 601 are formed in the semiconductor layer 107 according to one embodiment. In one embodiment, forming the recesses 601 involves selectively etching the portions 701 of the semiconductor layer 107. In one embodiment, the portions 701 of the semiconductor layer 107 are selectively etched down to the semiconductor layer 106 that acts as an etch stop layer. As shown in FIG. 6, the semiconductor layer 106 remains substantially intact by etching of the semiconductor layer 107.

In conventional techniques, time is used to control the etching of the source/drain recesses. Typically, the timed etch is not accurate. The timed etch may result in the recesses that are too shallow that increases a parasitic source/drain resistance. The timed etch may result in etching into the GaAs buffer layer that may increase a leakage current. Unlike in the convention techniques, the semiconductor layer 106 acting as an etch stop layer is used to precisely control the depth of the source/drain recesses 601 that ensures that the parasitic source/drain resistance and leakage current are substantially lower comparing to that of conventional devices.

In one embodiment, an etching rate of the semiconductor layer 107 is substantially greater than an etching rate of the semiconductor layer 106. In one embodiment, a ratio of the etching rate of the semiconductor layer 107 to the etching rate of the semiconductor layer 106 is at least 10:1.

In one embodiment, the portions 701 of the semiconductor layer 107 are removed selectively to semiconductor layer 106 using one or more selective etching techniques known to one of ordinary skill in the art of microelectronic device manufacturing, such as but not limited to a wet etching, a dry etching, or any combination thereof. In at least some embodiments, the portions 701 of semiconductor layer 107 of InGaAs are wet etched selectively to the semiconductor layer 106 of InP using a chemistry comprising a sulfuric acid, or citric acid, or hydrofluoric acid (HF) with hydrogen peroxide (H2O2).

Figure 7:
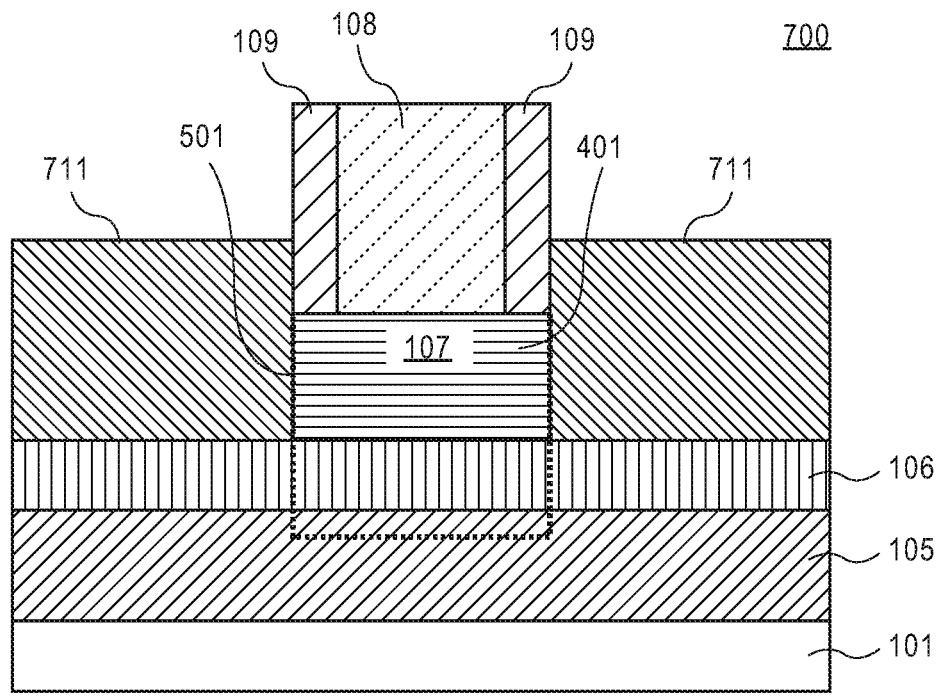
FIG. 7 is a view similar to FIG. 6, after source/drain portions are formed in the recesses according to one embodiment.

FIG. 7 is a view 700 similar to FIG. 6, after source/drain portions (regions) 711 are formed in the recesses 601 according to one embodiment. As shown in FIG. 7, source/drain portions 711 are deposited adjacent to the outside sidewalls of the spacers 109 and channel portion 401 of the semiconductor layer 107 on the exposed portions of the semiconductor layer 106. In one embodiment, the source/drain portions 711 are deposited to the thickness such that upper portions of the outside sidewalls of the spacers 109 are exposed, as shown in FIG. 7.

In one embodiment, forming source/drain regions 711 involves depositing a heavily doped semiconductor material in the recesses 601. In one embodiment, the material of the source/drain regions is similar to that of the material of the semiconductor layer 107. In another embodiment, the material of the source/drain regions 711 is different from that of the semiconductor layer 107. In one embodiment, the channel portion of the semiconductor layer 107 and the source/drain portions 711 are InGaAs portions.

In one embodiment, the dopant concentration in the source/drain regions 711 is substantially greater than in the semiconductor layer 107. In at least some embodiments, the source/drain regions 711 are firmed of the same conductivity type such as N-type or P-type conductivity. In another embodiment, the source and drain regions 711 are doped of opposite type conductivity to form a tunnel field effect transistor (TFET). Typically, the TFET device structure comprises a P-type source region, an intrinsic channel region and an N-type drain region, in which the electrostatic potential of the intrinsic region is controlled by a gate terminal.

In an embodiment, the source/drain portions 711 have a doping concentration of between about $1\times10^{19}$ atoms/cm$^3$ and about $1\times10^{21}$ atoms/cm$^3$. In an embodiment, the channel portion 401 is intrinsic or undoped. In an embodiment, the channel portion 401 is doped, for example to a conductivity level of between $1\times10^{16}$ to $1\times10^{19}$ atoms/cm$^3$. In an embodiment, when the channel portion is doped it is typically doped to the opposite conductivity type of the source/drain portion. For example, when the source/drain regions are N-type conductivity the channel portion would be doped to a P-type conductivity. Similarly, when the source/drain regions are P-type conductivity the channel portion would be N-type conductivity. In this manner a fin based transistor can be formed into either a NMOS transistor or a PMOS transistor respectively. The channel portion can be uniformly doped or can be doped non-uniformly or with differing concentrations to provide particular electrical and performance characteristics. For example, channel portion can include halo regions, if desired. The source/drain regions 711 can be formed of uniform concentration or can include sub-regions of different concentrations or doping profiles such as tip regions (e.g., source/drain extensions). In an embodiment, the source/drain regions 711 have the same doping concentration and profile. In an embodiment, the doping concentration and profile of the source/drain regions 711 vary to obtain a particular electrical characteristic. In one embodiment, the portion of the fin 301 located between the source/drain regions 711 defines the channel portion of the transistor. The channel portion can also be defined as the area of the semiconductor fin 301 surrounded by the gate electrode. At times however, the source/drain regions 711 may extend slightly beneath the gate electrode through, for example, diffusion to define the channel portion slightly smaller than the gate electrode length (Lg). In at least some embodiments, the source/drain regions 711 extend slightly beneath the spacers 109 through, for example, diffusion to define the length of the channel portion slightly smaller than the length of the channel portion 401.

In at least some embodiments, source/drain portions 711 are deposited into recesses 601 using one or more of deposition techniques known to one of ordinary skill in the art of microelectronic device manufacturing, such as but not limited to a CND, a PVD, an MBE, an MOCVD, an ALD, spin-on, or other deposition technique.

Figure 8:
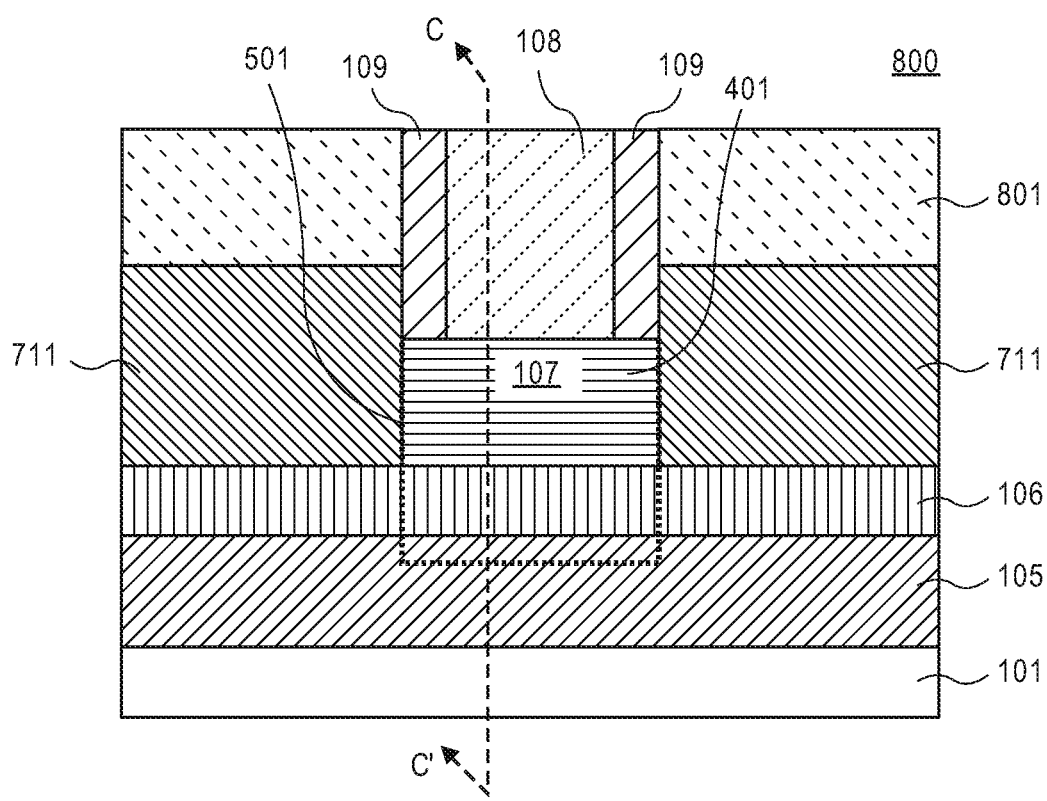
FIG. 8 is a view similar to FIG. 7 after an insulating layer is deposited on the top surfaces of the source/drain portions according to one embodiment.

FIG. 8 is a view 800 similar to FIG. 7 after an insulating layer 801 is deposited on the top surfaces of the source/drain portions 711 according to one embodiment. A cross-sectional view of the electronic device structure along an axis C-C' depicted in FIG. 8 is illustrated in FIG. 3 according to one embodiment. In one embodiment, insulating layer 801 can be any material suitable to insulate adjacent devices and prevent leakage. In one embodiment, insulating layer 801 is an oxide layer, e.g., silicon dioxide, or any other electrically insulating layer determined by an electronic device design. In one embodiment, insulating layer 801 comprises an interlayer dielectric (ILD). In one embodiment, insulating layer 801 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof.

In an embodiment, the insulating layer is deposited on the substrate using one of the deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing. In one embodiment, the insulating layer 801 is deposited on the source/drain portions 711 and on top portions of the spacers 109 and gate electrode stack 108. The insulating layer 801 is then polished back to be planar with the top portions of the spacers 109 and gate electrode stack 108 using a chemical mechanical polishing (CMP) process as known to one of ordinary skill in the art of microelectronic device manufacturing.

Figure 9A:
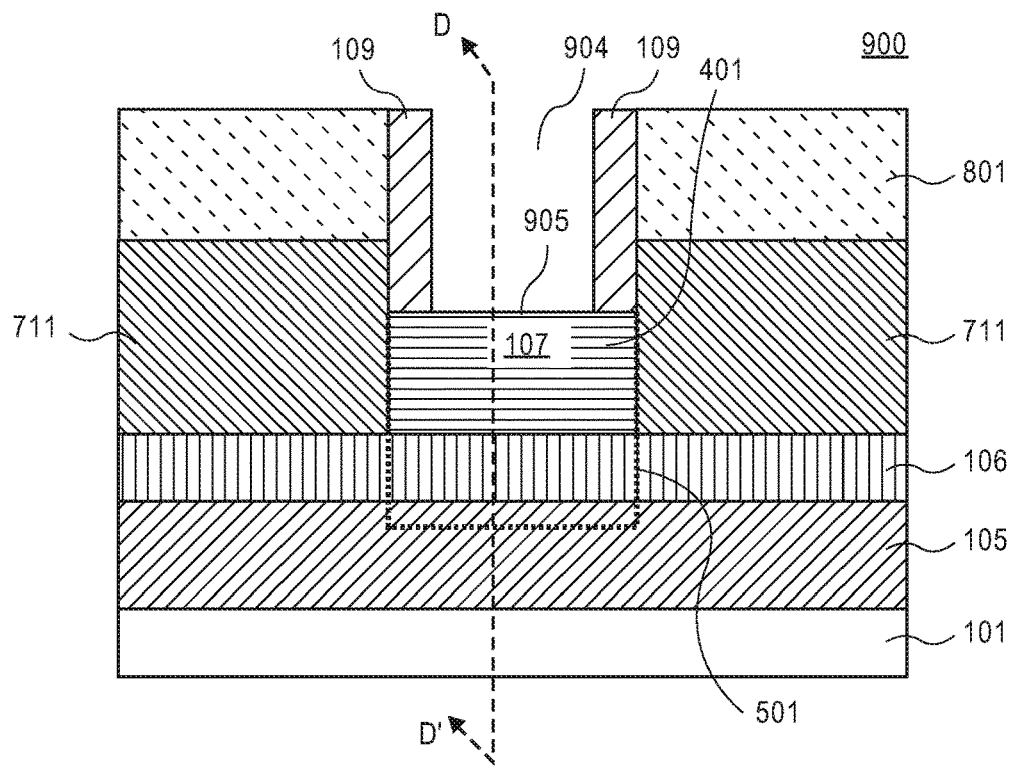
FIG. 9A is a view similar to FIG. 8, after a dummy gate electrode stack is removed according to one embodiment.

FIG. 9A is a view 900 similar to FIG. 8, after dummy gate electrode stack 108 is removed from the top portion 302 and opposing sidewalls 303 of the channel portion 401 of the fin 301 according to one embodiment. FIG. 10 is a cross-sectional view 1000 of the electronic device structure along an axis D-D' depicted in FIG. 9 according to one embodiment. As shown in FIG. 9A, a trench 904 is formed by removing dummy gate electrode stack 108. The trench has opposing sidewalls formed by spacers 109 and a bottom that is a top surface 905 of the channel portion 401. The dummy gate electrode stack can be removed using one or more of the dummy gate electrode stacks removal techniques known to one of ordinary skill in the art of electronic device manufacturing.

Figure 9B:
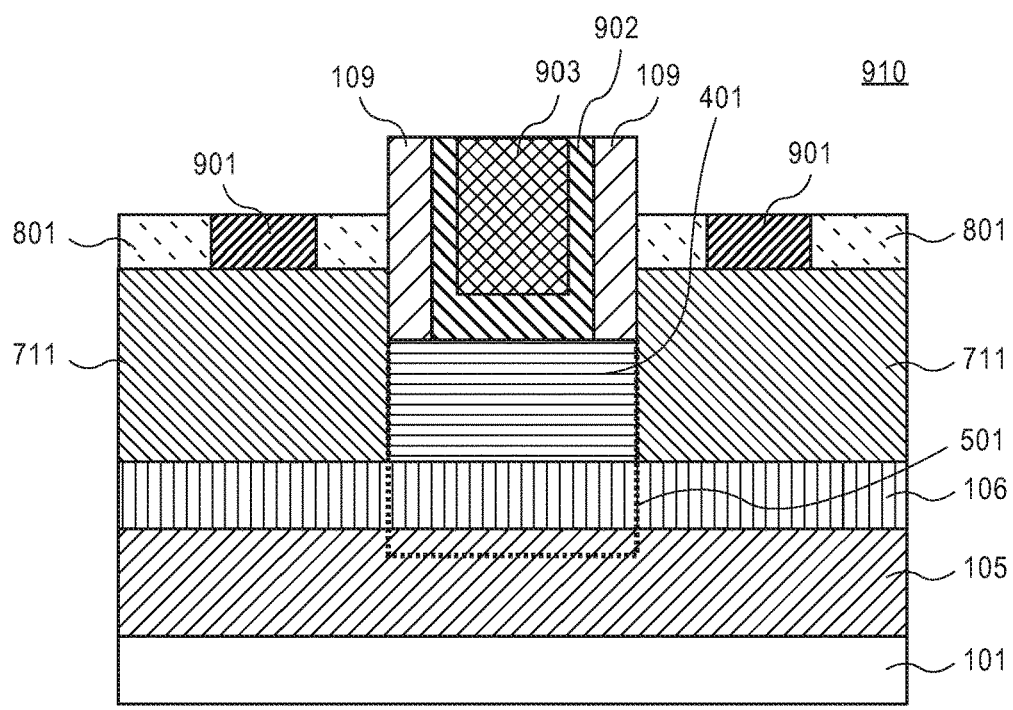
FIG. 9B is a view similar to FIG. 9A after depositing a gate electrode layer on a gate dielectric layer on the channel portion of the fin and forming a conductive layer in openings in insulating layer to provide contacts to the source/drain regions according to one embodiment.
Figure 10:
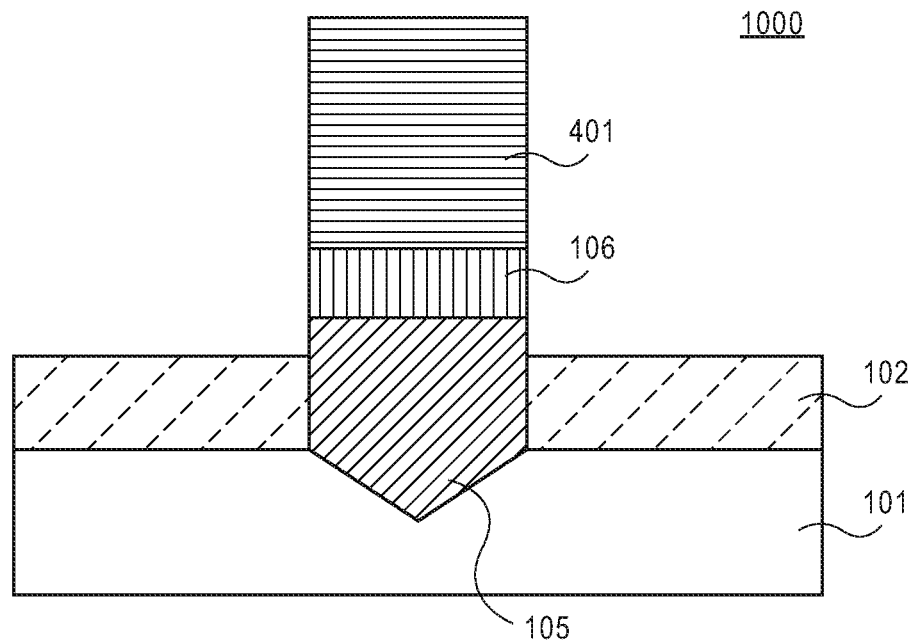
FIG. 10 is a cross-sectional view of the electronic device structure along an axis D-D' depicted in FIG. 9 according to one embodiment.

FIG. 9B is a view 910 similar to FIG. 9A after depositing a gate electrode layer 903 on a gate dielectric layer 902 on the channel portion of the fin and forming a conductive layer 901 in openings in insulating layer 801 to provide contacts to the source/drain regions 711 according to one embodiment. As shown in FIG. 9B, gate dielectric layer 902 is deposited on the sidewalls and bottom 905 of the trench 904, and gate electrode layer 903 is deposited on the gate dielectric layer 902. As shown in FIG. 9B, insulating layer 801 is recessed to expose upper portions of the outside sidewalls of the spacers 109.

In one embodiment, gate electrode layer 903 is deposited on gate dielectric layer 902 on three sides including the top portion 302 and sidewalls 303 of the channel portion 401 of the fin 301. In one embodiment, the electronic device structure depicted in FIG. 9B is a tri-gate transistor structure.

In one embodiment, conductive layer 901 comprises a metal e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, other metal layer, or any combination thereof.

In alternative embodiments, examples of the conductive materials that may be used for the contact layer are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In an embodiment, conductive layer 901 is deposited using one of conductive layer deposition techniques, such as but not limited to a CVD, PVD, MBE, MOCVD, ALD, spin-on, electroless, electro-plating, or other deposition techniques known to one of ordinary skill in the art of microelectronic device manufacturing.

In one embodiment, the gate dielectric layer 902 is an oxide layer, e.g., a silicon oxide layer, an aluminum oxide, a hafnium containing oxide, or any combination thereof. In one embodiment, the gate dielectric layer 902 is a high-k dielectric material, for example, hafnium oxide, hafnium silicon oxide, hafnium zirconium oxide (HfxZryOz), lanthanum oxide (La2O3), lanthanum aluminum oxide, zirconium oxide, zirconium silicon oxide, tantalum oxide, tantalum silicate (TaSiOx), titanium oxide, barium strontium titanium oxide, barium titanium oxide, strontium titanium oxide, yttrium oxide, aluminum oxide (e.g., Al2O3), lead scandium tantalum oxide, and lead zinc niobate, or other high-k dielectric materials. In one embodiment, the thickness of the gate dielectric layer is from about 2 angstroms (Å) to about 20 Å.

In alternative embodiments, the gate dielectric layer is deposited using one of deposition techniques, such as but not limited to, a CVD, a PVD, an MBE, an MOCVD, an ALD, spin-on, or other deposition techniques known to one of ordinary skill in the art of microelectronic device manufacturing. In at least some embodiments, the gate dielectric layer is patterned and etched using one or more gate dielectric layer patterning and etching techniques known to one of ordinary skill in the art of microelectronic device manufacturing.

The gate electrode layer 903 can be formed of any suitable gate electrode material. The gate electrode may comprise a metal-containing material e.g., Pt/Au, Ti/Au, Ti/Pt/Au, or another material or materials. In various embodiments, the material or materials of the gate electrode layer 903 may be chosen to provide a desired work function or doped appropriately to facilitate an ohmic contact. In an embodiment, the gate electrode layer 903 can be a metal gate electrode layer, such as but not limited to, tungsten, tantalum, titanium, and their nitrides. It is to be appreciated, the gate electrode layer need not necessarily be a single material and can be a composite stack of thin films, such as but not limited to a polycrystalline silicon/metal electrode or a metal/polycrystalline silicon electrode. The gate electrode layer 903 can be deposited using one of the gate electrode layer deposition techniques, such as but not limited to a CVD, PVD, MBE, MOCVD, ALD, spin-on, electroless, electro-plating, or other deposition techniques known to one of ordinary skill in the art of microelectronic device manufacturing.

Figure 11A:
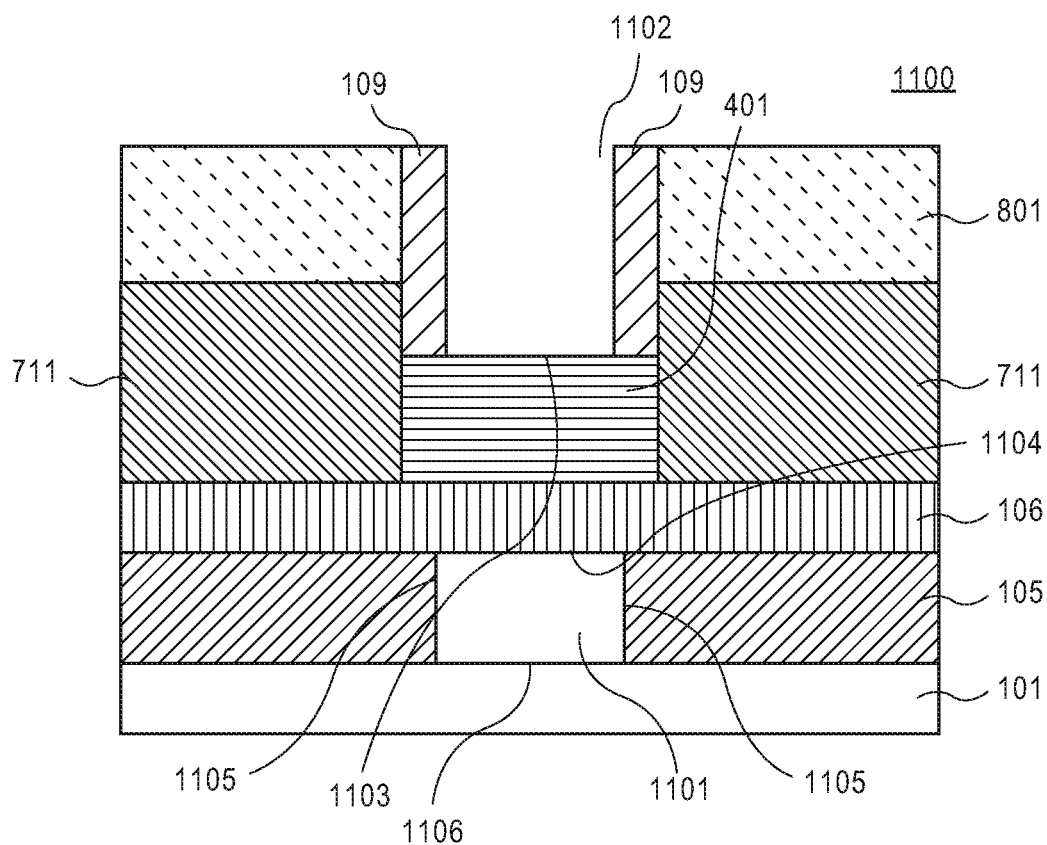
FIG. 11A is a view similar to FIG. 8, after the dummy gate electrode stack is removed and a portion of the buffer layer is removed to release a portion of the fin to form a GAA transistor structure according to another embodiment.

FIG. 11A is a view 1100 similar to FIG. 8, after the dummy gate electrode stack 108 is removed and a portion of the buffer layer 105 is removed to release a portion of the fin 301 to form a GAA transistor structure according to another embodiment. As shown in FIG. 11A, the dummy gate electrode stack 108 is removed from top portion 302, and opposing sidewalls 303 of the channel portion 401 of the fin 301 to form a trench 1102. The trench 1102 has opposing sidewalls formed by spacers 109 and a bottom that is a top surface 1103 of the channel portion 401, The dummy gate electrode stack can be removed using one or more of the dummy gate electrode stacks removal techniques known to one of ordinary skill in the art of electronic device manufacturing.

A portion of the buffer layer 105 underneath a bottom surface 1104 of the semiconductor layer 106 underneath the channel portion of the semiconductor layer 107 is selectively removed to form a gap 1101 between an upper surface 1106 of the substrate 101 and bottom portion 1104 to release a portion of the fin 301 to form a GAA device. As shown in FIG. 11A, gap 1101 is defined by surface 1104, surface 1106 and opposing sidewalls 1105 that are sidewalls of the remaining portions of the buffer layer 105.

In one embodiment, the portion of the buffer layer 105 is etched selectively to semiconductor layer 106 and semiconductor layer 107 to form gap 1101 using one or more selective etching techniques known to one of ordinary skill in the art of microelectronic device manufacturing, such as but not limited to a wet etching, a dry etching, or any combination thereof. In at least some embodiments, the portion of the buffer layer 105 of GaAs is etched selectively to the semiconductor layer 106 of InP and semiconductor layer 107 of InGaAs using a chemistry comprising an ammonium hydroxide (NH4OH) with H2O2.

FIG. 11B is a view 1110 similar to FIG. 11A after depositing gate electrode layer 903 on gate dielectric layer 902 on the channel portion of the fin and forming conductive layer 901 in openings in insulating layer 801 to provide contacts to the source/drain regions 711 according to one embodiment. FIG. 11B illustrates an embodiment having the source/drain regions 711 extending slightly beneath the spacers 109. FIG. 11C is a cross-sectional view 1120 of a portion of the electronic device structure along an axis E-E' depicted in FIG. 11B according to one embodiment.

As shown in FIGS. 11B and 11C, gate dielectric layer 902 is deposited on the sidewalls and the bottom of the trench 1102, on surface 1104, surface 1106 and sidewalls 1105 of the gap 1101, and gate electrode layer 903 is deposited on gate dielectric layer 902. As shown in FIGS. 11B and 11C, gate electrode layer 903 is deposited on gate dielectric layer 902 on and around all sides of channel portion of the fin 301 including the top portion 302, sidewalls 303, and bottom surface 1104.

In one embodiment, the electronic device structure depicted in FIG. 11B is a GAA transistor structure. As shown in FIG. 11B, a bottom gate electrode stack 1111 comprises a portion of the gate electrode layer 903 on a portion of the gate dielectric layer 902 on bottom surface 1104 of the channel portion of the fin 301. In one embodiment, a portion semiconductor layer 106 that is a part of the transistor channel deposited underneath the gate dielectric layer acts as a capping layer to reduce a gate induced drain leakage (GIDL) current at the bottom gate electrode stack 1111. As shown in FIG. 11B, edges of the channel portion 401 are not aligned to external sidewalls of spacers 109. As shown in FIG. 11B, the edges of the channel portion 401 slightly undercut the external sidewalls of spacers 109. In one embodiment, the electronic device structure depicted in FIG. 11B is a GAA transistor structure.

FIG. 11D is a gate cut view 1130 illustrating a portion of an electronic device structure similar to FIG. 11A after removing a portion of the semiconductor layer 106 underneath the channel portion of the semiconductor layer 107 and after depositing gate electrode layer 903 on gate dielectric layer 902 according to one embodiment. Gate cut view 1130 is a view similar to the view 1120 of FIG. 11C according to one embodiment. FIG. 11D is different from FIG. 11C in that the portion of the semiconductor layer 106 underneath the channel portion of the semiconductor layer 107 is selectively removed. In this embodiment, gate electrode layer 903 is deposited on gate dielectric layer 902 that is deposited on and around all sides of the channel portion of the fin including the top portion 302, sidewalls 303 and a bottom portion 1131 of the semiconductor layer 107.

In one embodiment, the portion of the semiconductor layer 106 is removed selectively to the channel portion of the semiconductor layer 107 using one or more selective etching techniques known to one of ordinary skill in the art of microelectronic device manufacturing, such as but not limited to a wet etching, a dry etching, or any combination thereof. In at least some embodiments, the portion of semiconductor layer 106 of InP is wet etched selectively to the channel portion of the semiconductor layer 107 of InGaAs using a chemistry comprising a high concentration of hydrochloric acid (HCl). In at least some embodiments, the concentration of HCl in the etching solution is at least 1:1.

Figure 12:
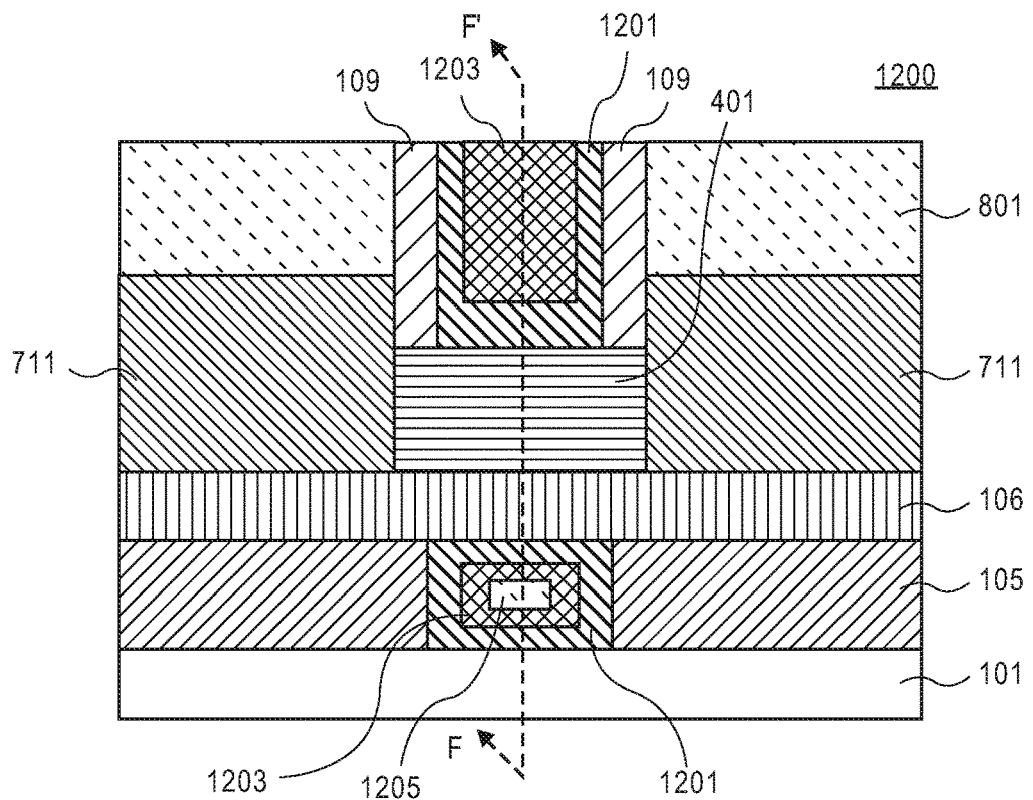
FIG. 12 is a view similar to FIG. 11A after depositing a gate electrode layer on a gate dielectric layer on the channel portion of the fin according to another embodiment.
Figure 13:
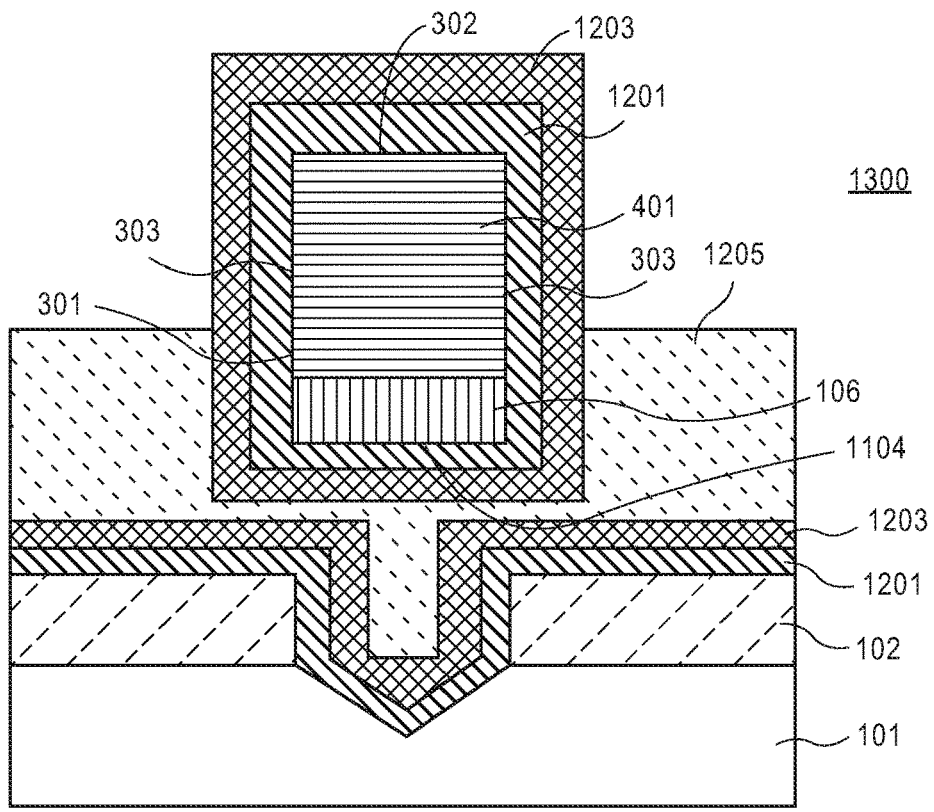
FIG. 13 is a cross-sectional view illustrating a portion of the electronic device structure along an axis F-F' depicted in FIG. 12 according to one embodiment.

FIG. 12 is a view 1200 similar to FIG. 11A after depositing a gate electrode layer 1203 on a gate dielectric layer 1201 on the channel portion of the fin according to another embodiment. FIG. 13 is a cross-sectional view 1300 illustrating a portion of the electronic device structure along an axis F-F' depicted in FIG. 12 according to one embodiment.

In one embodiment, gate electrode layer 1203 represents gate electrode layer 903. In one embodiment, gate dielectric layer 1201 represents gate dielectric layer 902. As shown in FIGS. 12 and 13, gate dielectric layer 1201 is deposited on the sidewalls and the bottom of the trench 1102, on surface 1104, surface 1106 and sidewalls 1105 of the gap 1101, and gate electrode layer 903 is deposited on gate dielectric layer 902. As shown in FIGS. 12 and 13, an insulating layer 1205 is deposited on a portion of gate electrode layer 1203. In one embodiment, insulating layer 1205 represents one of the insulating layers described above with respect to insulating layer 102. As shown in FIGS. 12 and 13, gate electrode layer 1203 is deposited on gate dielectric layer 1201 that is on and around all sides including the top portion 302, sidewalls 303 and bottom portion 1104 of the semiconductor layer 106 that is a part of the channel portion of the fin 301. In one embodiment, the bottom portion 1104 of the semiconductor layer 106 acts as a capping layer to reduce a parasitic leakage current at the bottom portion of the gate electrode 1203. As shown in FIG. 12, the edges of the channel portion 401 are aligned to external sidewalls of spacers 109. In one embodiment, the electronic device structure depicted in FIGS. 12 and 13 is a GAA transistor structure.

Figure 14:
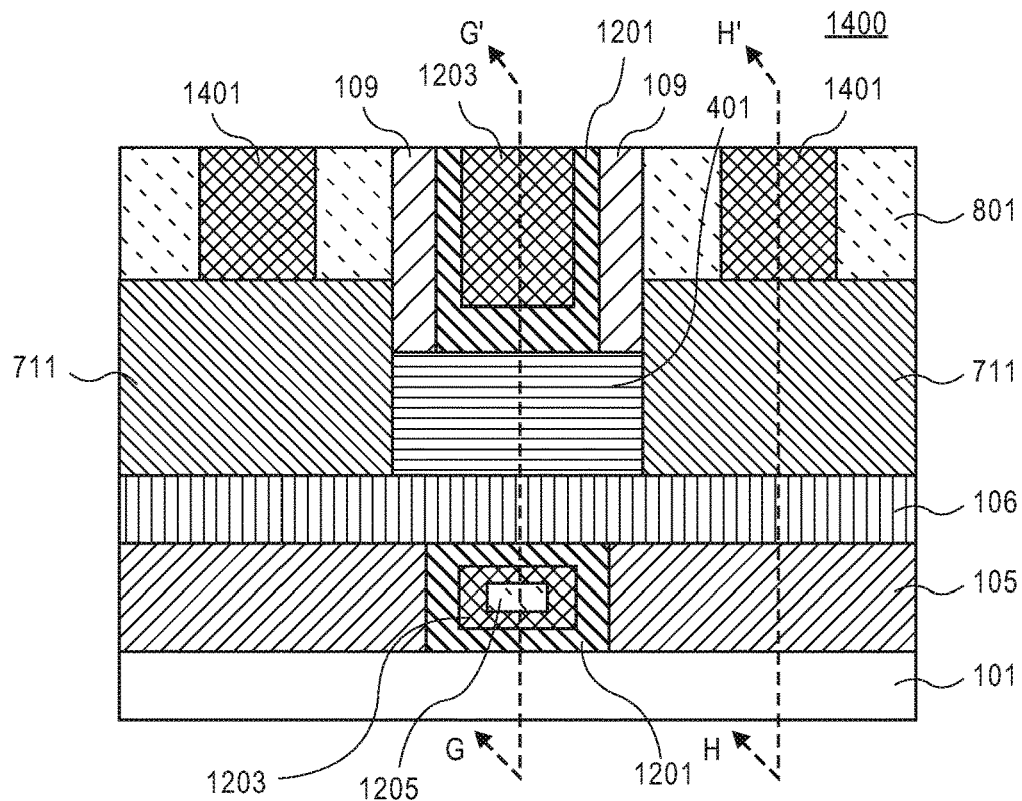
FIG. 14 is a view similar to FIG. 12, after forming a conductive layer in openings in an insulating layer to provide contacts to the source/drain regions according to another embodiment.
Figure 15:
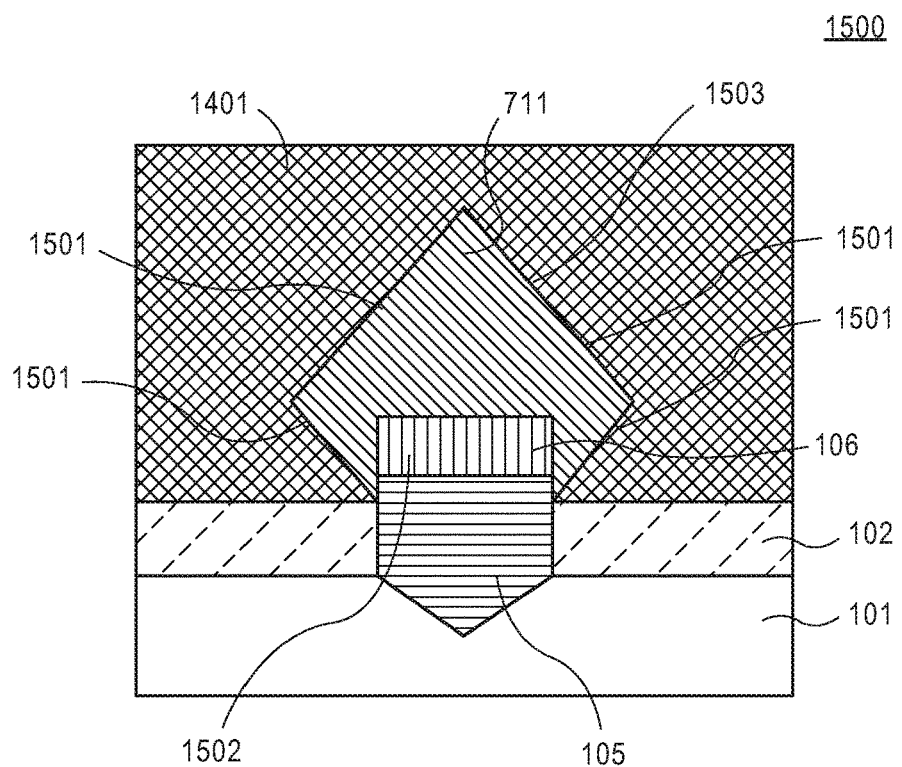
FIG. 15 represents a cross-sectional view illustrating a portion of the electronic device structure along an axis H-H' depicted in FIG. 14 according to one embodiment.

FIG. 14 is a view 1400 similar to FIG. 12, after forming conductive layer 1401 in openings in insulating layer 801 to provide contacts to the source/drain regions 711 according to another embodiment. In one embodiment, conductive layer 1401 represents conductive layer 901. FIG. 15 represents a cross-sectional view 1500 illustrating a portion of the electronic device structure along an axis H-H' depicted in FIG. 14 according to one embodiment. A cross-sectional view illustrating a portion of the electronic device structure along an axis G-G' depicted in FIG. 14 is represented by cross-sectional view 1300 in FIG. 13 according to one embodiment.

As shown in FIGS. 14 and 15, each of the source/drain regions 711 comprises a fin 1503 having a plurality of sides 1501. A fin portion 1502 of the semiconductor layer 106 is underneath the fin 1503. In one embodiment, the source/drain region fin 1503 is deposited on all sides of the fin portion 1502 of the semiconductor layer 106, as shown in FIG. 15. In one embodiment, the source/drain region fin 1503 extends onto upper portions of the sidewalls of the semiconductor buffer layer 105, as shown in FIG. 15.

Figure 16:
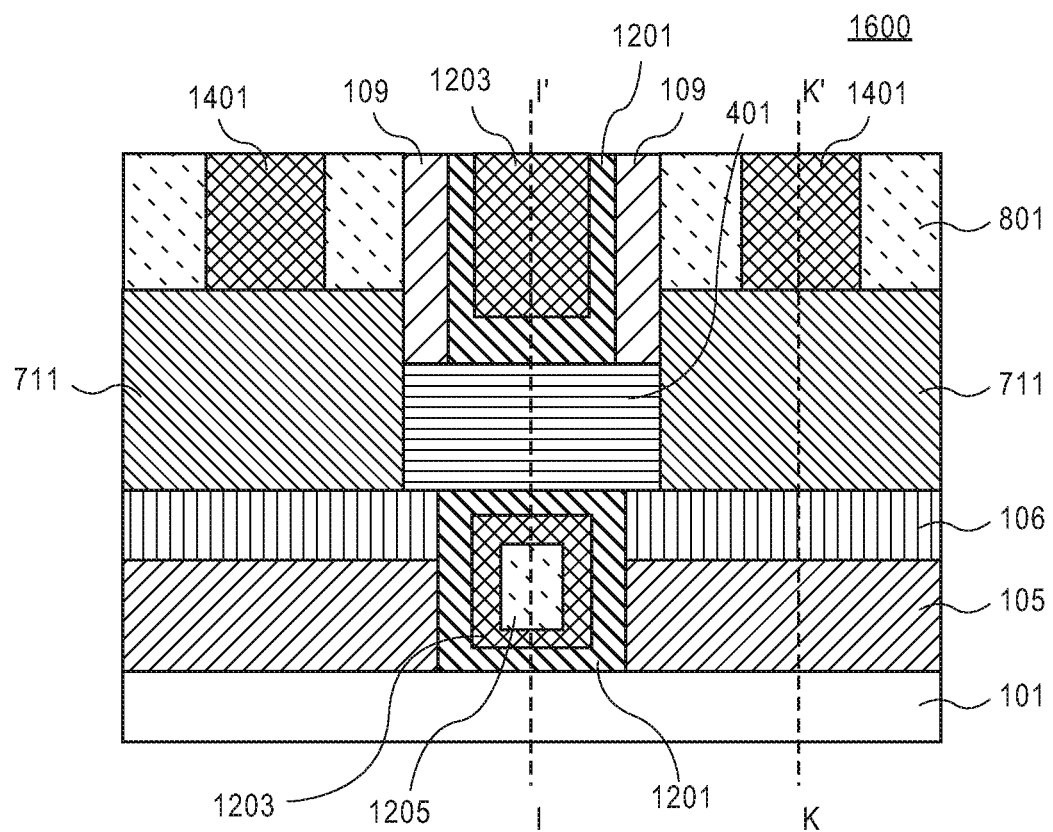
FIG. 16 is a view similar to FIG. 11A after depositing a gate electrode layer on a gate dielectric layer on the channel portion of the fin and forming a conductive layer in openings in the insulating layer to provide contacts to the source/drain regions according to another embodiment.
Figure 17:
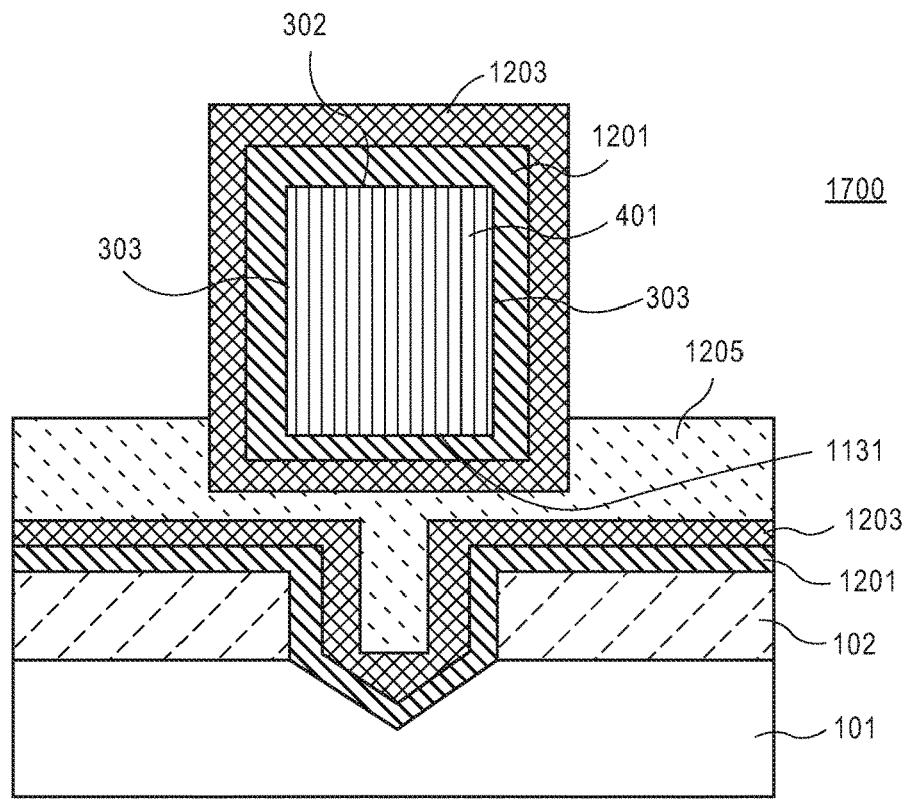
FIG. 17 is a cross-sectional view illustrating a portion of the electronic device structure along an axis I-I' depicted in FIG. 16 according to one embodiment.

FIG. 16 is a view 1600 similar to FIG. 11A after depositing a gate electrode layer 1203 on a gate dielectric layer 1201 on the channel portion of the fin and forming a conductive layer 1401 in openings in insulating layer 801 to provide contacts to the source/drain regions 711 according to another embodiment. FIG. 17 is a cross-sectional view 1700 illustrating a portion of the electronic device structure along an axis depicted in FIG. 16 according to one embodiment. A cross-sectional view illustrating a portion of the electronic device structure along an axis K-K' depicted in FIG. 16 is represented by cross-sectional view 1500 in FIG. 15 according to another embodiment.

Figure 18:
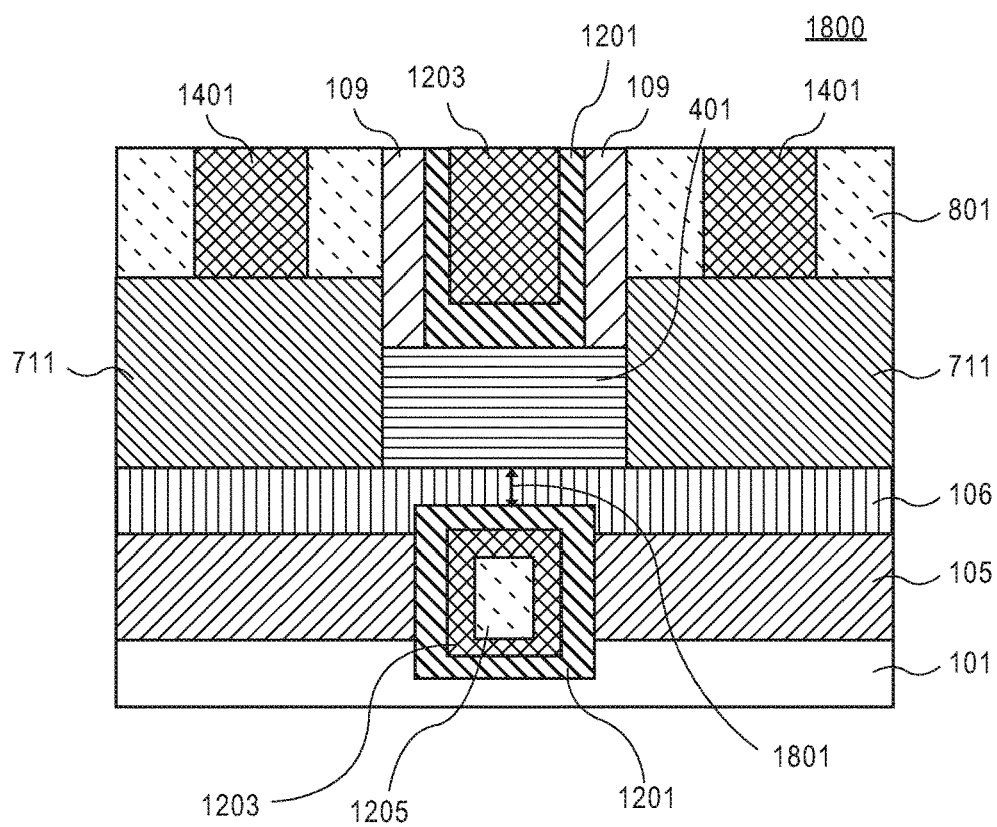
FIG. 18 is a view similar to FIG. 11A after depositing a gate electrode layer on a gate dielectric layer on the channel portion of the fin and forming a conductive layer in openings in an insulating layer to provide contacts to the source/drain regions according to yet another embodiment.

FIG. 18 is a view 1800 similar to FIG. 11A after depositing gate electrode layer 1203 on gate dielectric layer 1201 on the channel portion of the fin and forming conductive layer 1401 in openings in insulating layer 801 to provide contacts to the source/drain regions 711 according to yet another embodiment. The electronic device structures depicted in FIGS. 16 and 18 are different from the electronic device structure depicted in FIG. 14 in that a portion of the semiconductor layer 106 underneath the channel portion 401 of the fin 301 is selectively removed.

As shown in FIG. 16, the portion of the semiconductor layer 106 underneath the channel portion 401 of the fin 301 is completely removed, so that the gate dielectric layer 1201 is deposited directly on the bottom side of the channel portion 401. As shown in FIG. 17, electrode layer 1203 is deposited on gate dielectric layer 1201 that is deposited on and around all sides of the channel portion 401 of the fin 301 including the top portion 302, sidewalls 303 and bottom portion 1131 of the semiconductor layer 107. As shown in FIGS. 16 and 17, insulating layer 1205 is deposited on a portion of gate electrode layer 1203, as described above with respect to FIGS. 12 and 13.

As shown in FIG. 18, the portion of the semiconductor layer 106 underneath the channel portion 401 is removed partially to a thickness 1801, so that the gate dielectric layer 1201 is deposited on the remaining portion of the semiconductor layer 106 underneath the bottom side of the channel portion 401.

In one embodiment, the portion of the semiconductor layer 106 is removed selectively to the channel portion 401 of the semiconductor layer 107 using one or more selective etching techniques known to one of ordinary skill in the art of microelectronic device manufacturing, such as but not limited to a wet etching, a dry etching, or any combination thereof. In at least some embodiments, the portion of semiconductor layer 106 of InP is wet etched selectively to the channel portion of the semiconductor layer 107 of InGaAs using a chemistry comprising a high concentration of hydrochloric acid (HCl). In at least some embodiments, the concentration of HCl in the etching solution is at least 1:1.

Figure 19:
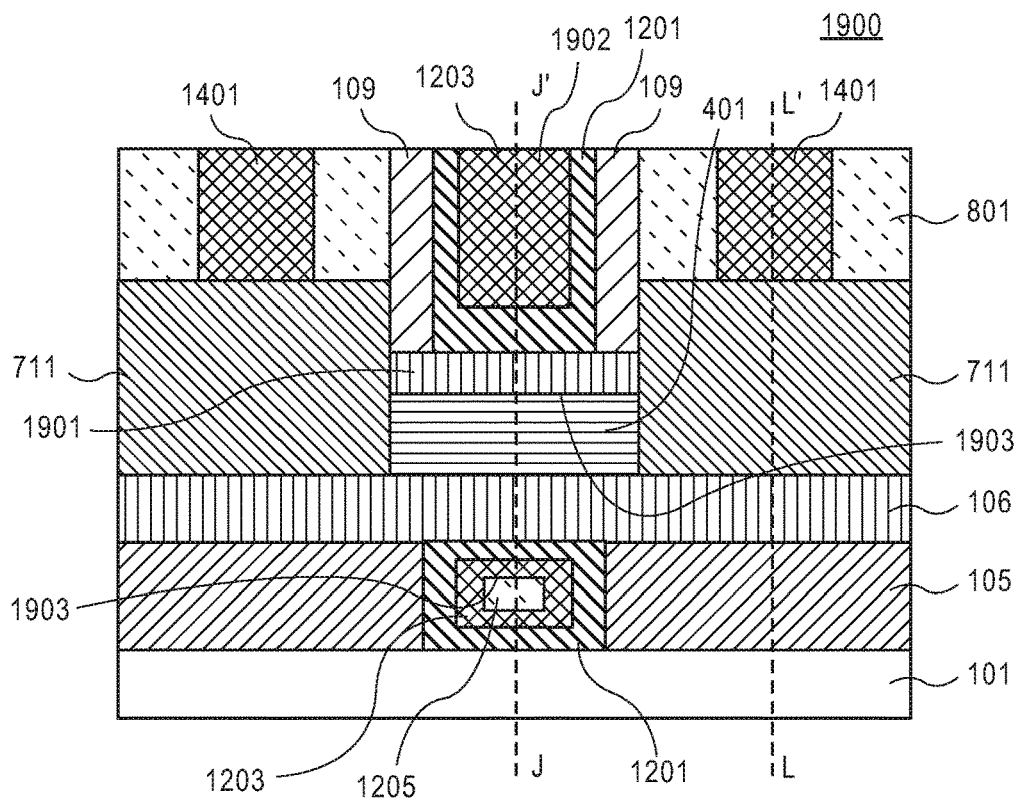
FIG. 19 is a view illustrating a portion of the electronic device structure according to another embodiment.
Figure 20:
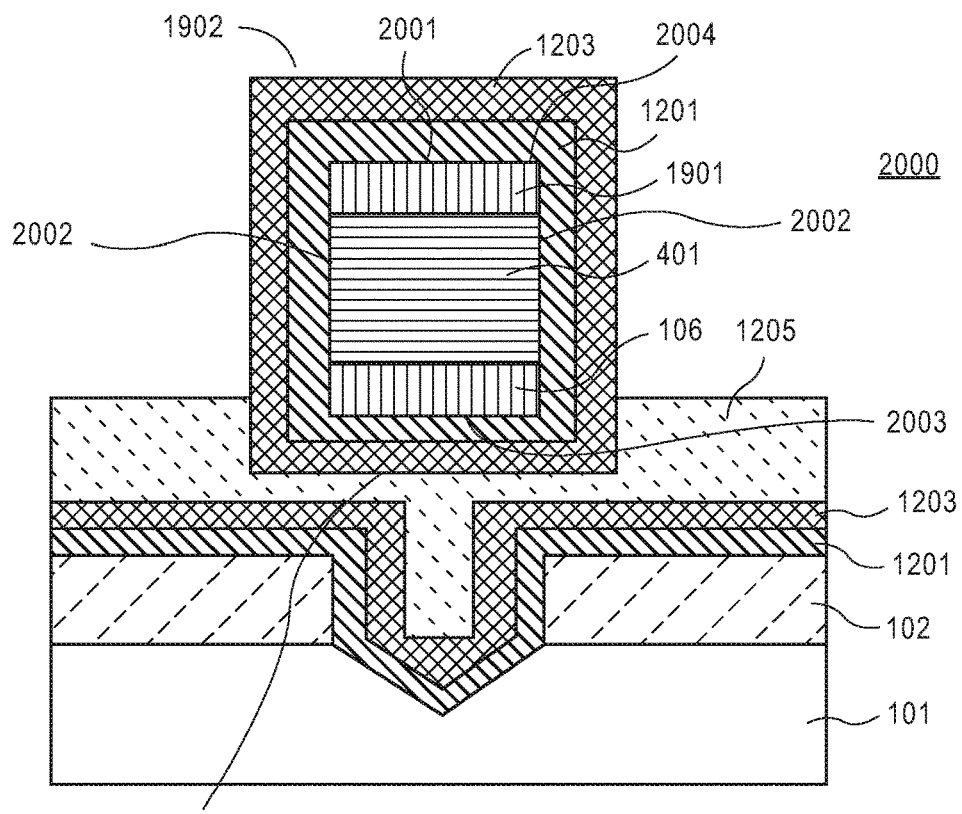
FIG. 20 is a cross-sectional view illustrating a portion of the electronic device structure along an axis depicted in FIG. 19 according to another embodiment.

FIG. 19 is a view 1900 illustrating a portion of the electronic device structure according to another embodiment. FIG. 20 is a cross-sectional view 2000 illustrating a portion of the electronic device structure along an axis J-J' depicted in FIG. 19 according to another embodiment. A cross-sectional view illustrating a portion of the electronic device structure along an axis L-L' depicted in FIG. 19 is represented by cross-sectional view 1500 in FIG. 15 according to another embodiment.

As shown in FIGS. 19 and 20 gate electrode layer 1203 is deposited on gate dielectric layer 1201 on the channel portion 401 of the fin. Conductive layer 1401 is formed in openings in insulating layer 801 to provide contacts to the source/drain regions 711. The electronic device structure depicted in FIGS. 19 and 20 is different from the electronic device structure depicted in FIGS. 13 and 14 in that a semiconductor layer 1901 is deposited on a top surface of the channel portion 401 of the semiconductor layer 107.

As shown in FIGS. 19 and 20, an upper gate electrode stack 1902 comprising gate electrode layer 1203 on gate dielectric layer 1201 is deposited on the semiconductor layer 1901 on an upper surface 1903 of the channel portion 401 of the semiconductor layer 107. In one embodiment, semiconductor layer 1901 represents one or more of the semiconductor layers described above with respect to semiconductor layer 106.

As shown in FIGS. 19 and 20, a bottom gate electrode stack 1904 comprises a portion of the gate electrode layer 1203 on a portion of the gate dielectric layer 1201 on bottom surface 2003 of the semiconductor layer 106. As shown in FIGS. 19 and 20, gate electrode layer 1203 is deposited on gate dielectric layer 1201 on and around all sides of a fin 2004 including a top portion 2001, sidewalls 2002, and bottom surface 2003 of the semiconductor layer 106. In one embodiment, the thickness of the semiconductor layer 1901 is from about 2 nm to about 10 nm. In one embodiment, semiconductor layer 1901 of InP is deposited on the upper surface of the channel portion of the semiconductor layer 107 of InGaAs on the semiconductor layer 106 of InP.

In at least some embodiments, semiconductor layer 1901 is deposited using one or more of epitaxial techniques known to one of ordinary skill in the art of microelectronic device manufacturing, such as but not limited to a CVD, a PVD, an MBE, an MOCVD, an ALD, spin-on, or other epitaxial growth technique.

Figure 21:
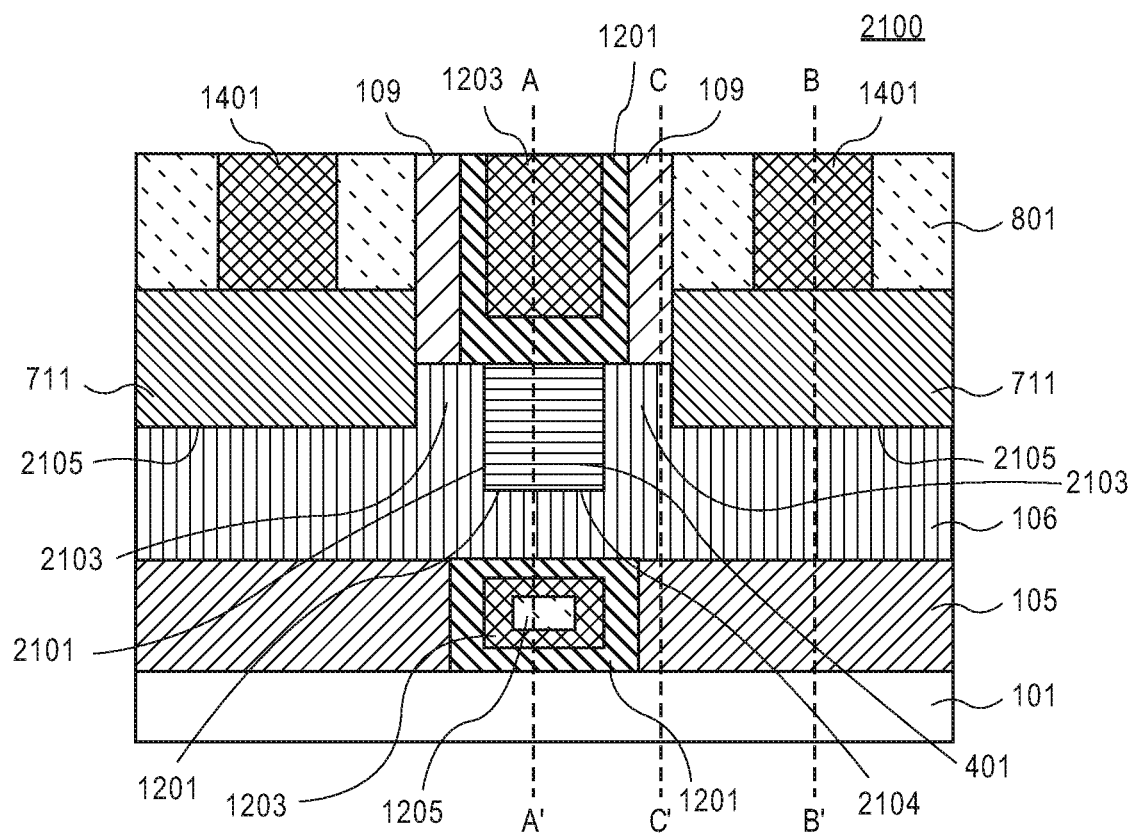
FIG. 21 is a view illustrating a portion of the electronic device structure according to another embodiment.
Figure 22:
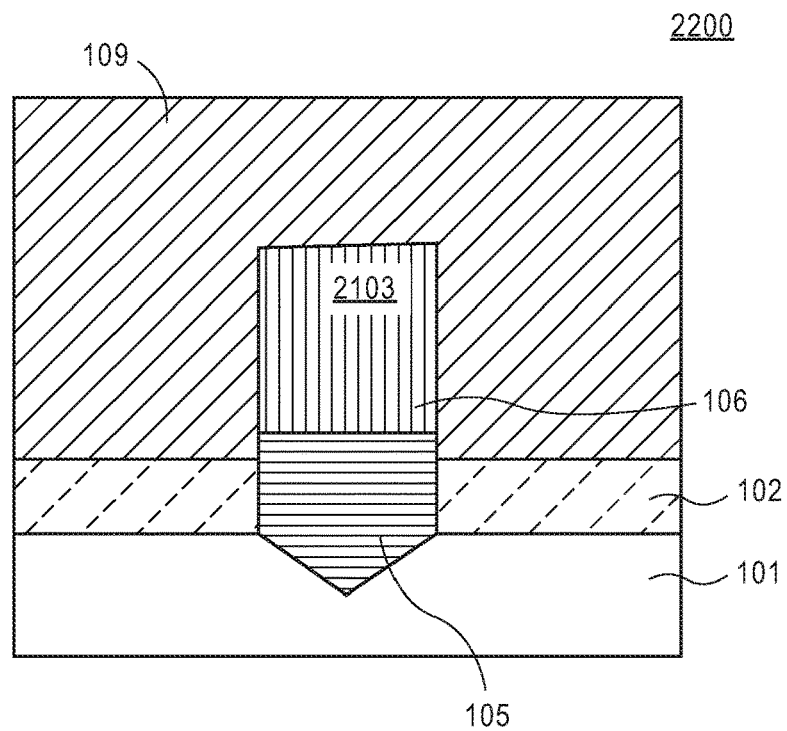
FIG. 22 is a cross-sectional view illustrating a portion of the electronic device structure along an axis C-C' depicted in FIG. 21 according to another embodiment.

FIG. 21 is a view 2100 illustrating a portion of the electronic device structure according to another embodiment. A cross-sectional view illustrating a portion of the electronic device structure along an axis A-A' depicted in FIG. 21 is represented by cross-sectional view 1300 in FIG. 13 according to another embodiment. A cross-sectional view illustrating a portion of the electronic device structure along an axis B-B' depicted in FIG. 21 is represented by cross-sectional view 1500 in FIG. 15 according to another embodiment. FIG. 22 is a cross-sectional view 2200 illustrating a portion of the electronic device structure along an axis C-C' depicted in FIG. 21 according to another embodiment.

The electronic device structure depicted in FIG. 21 is different from the electronic device structure depicted in FIG. 14 in that semiconductor layer 106 comprises a trench 2101 having opposing sidewall portions 2103 and a bottom 2104. Channel portion 401 of the semiconductor layer 107 is on bottom 2104 and opposing sidewall portions 2103 of the trench 2101. A portion of the dielectric layer 1201 is deposited on channel portion 401 of the semiconductor layer 107 and on portions 2103 of the semiconductor layer 106. The semiconductor layer 106 is recessed to form recessed portions 2105. As shown in FIG. 21, the source/drain portions 711 are deposited on the recessed portions 2105 and the sidewall portions 2103 to reduce a parasitic leakage current at the upper portion of the gate electrode layer 1203. In one embodiment, the recessed portions In one embodiment, forming of the trench 2101 and recessing of the portions of the semiconductor layer 106 is performed selectively to the channel portion of the semiconductor layer 107 using one or more selective etching techniques known to one of ordinary skill in the art of microelectronic device manufacturing, such as but not limited to a wet etching, a dry etching, or any combination thereof. In at least some embodiments, forming of the trench 2101 and recessing of the portions of the semiconductor layer 106 of InP is performed selectively to the channel portion of the semiconductor layer 107 of InGaAs using a wet etch chemistry comprising a high concentration of hydrochloric acid (HCl), In at least some embodiments, the concentration of HCl in the etching solution is at least 1:1.

The spacers 109 are deposited on portions 2103 of the semiconductor layer 106, as shown in FIGS. 21 and 22. Each of the spacers 109 is deposited on the top surface and opposing sidewalk of the portion 2103 of the semiconductor layer 106, as shown in FIG. 22.

As shown in FIG. 21, gate electrode layer 1203 is deposited on gate dielectric layer 1201 on the channel portion 401 of the fin. Conductive layer 1401 is formed in openings in insulating layer 801 to provide contacts to the source/drain regions 711, as described above.

Figure 23:
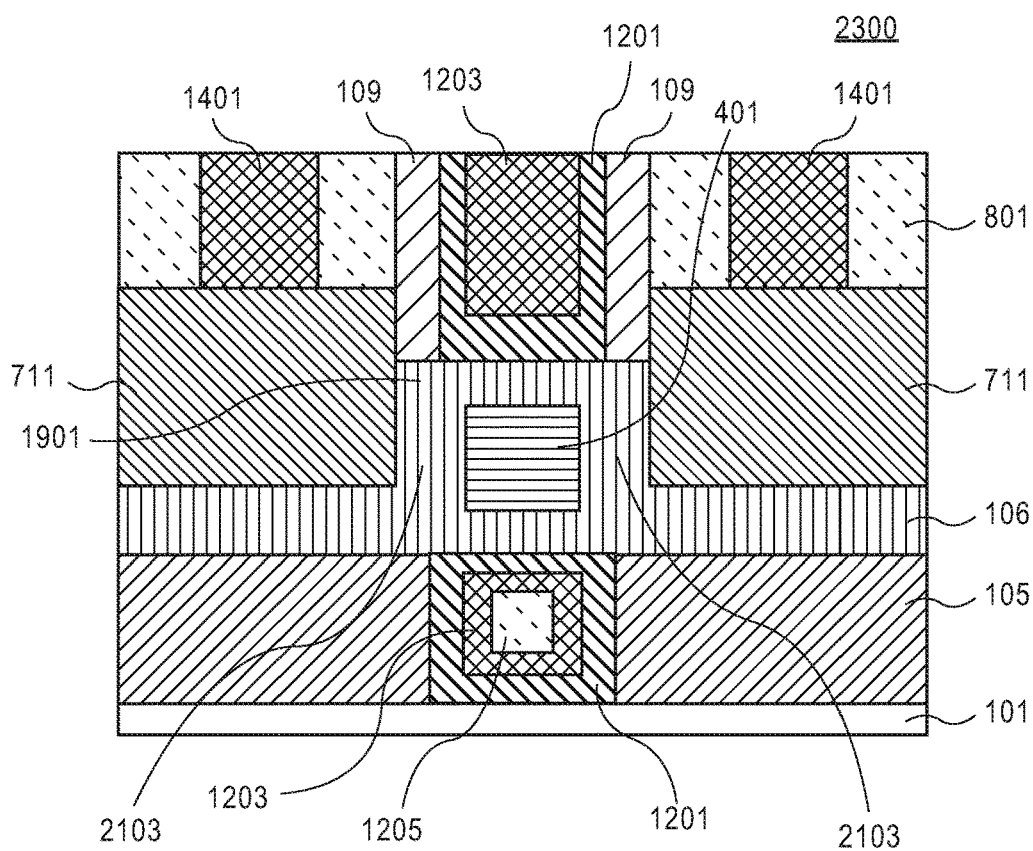
FIG. 23 is a view illustrating a portion of the electronic device structure according to another embodiment.

FIG. 23 is a view 2300 illustrating a portion of the electronic device structure according to another embodiment. The electronic device structure depicted in FIG. 23 is different from the electronic device structure depicted in FIG. 21 in that semiconductor layer 1901 is deposited on on the top surface of the channel portion 401 of the semiconductor layer 107 and top surfaces of the sidewall portions 2103 of the semiconductor layer. In one embodiment, semiconductor layer 1901 represents one or more of the semiconductor layers described above with respect to semiconductor layer 106.

Figure 24:
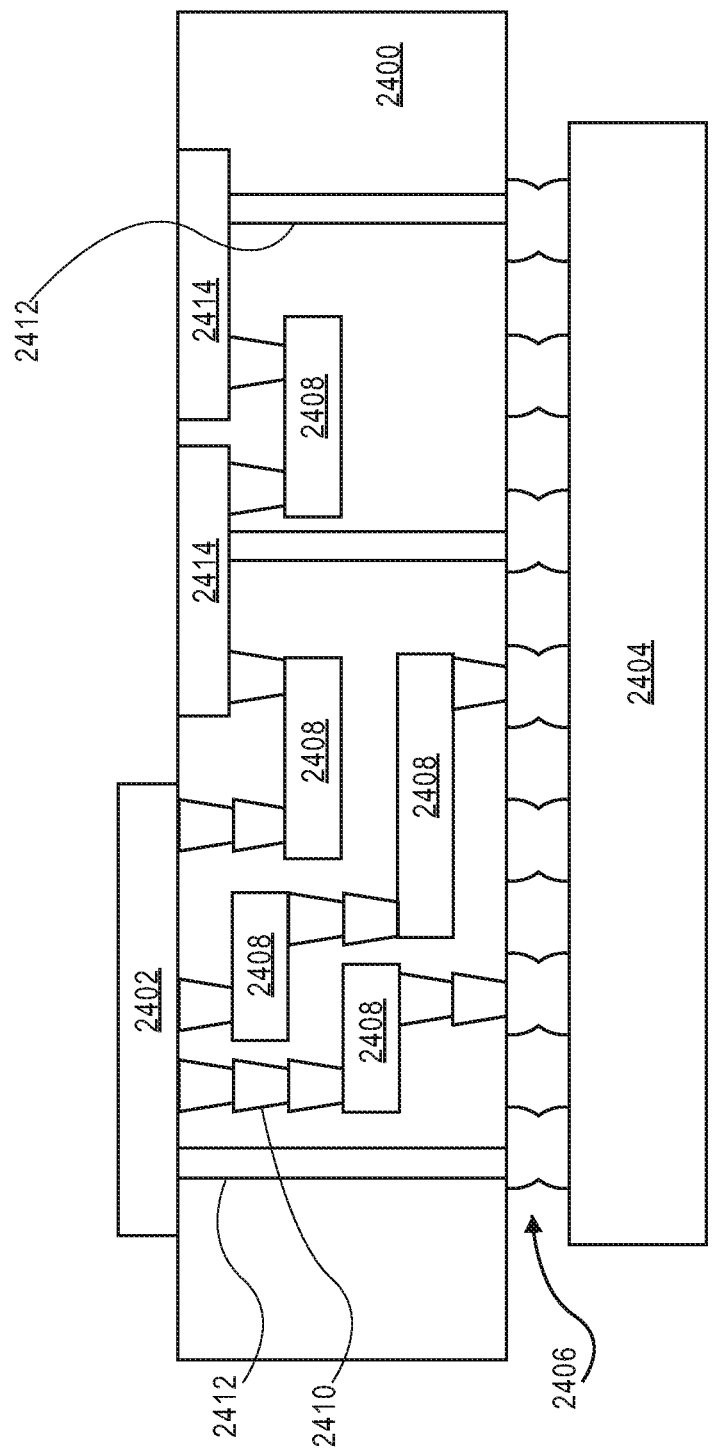
FIG. 24 illustrates an interposer that includes one or more embodiments of the invention.

FIG. 24 illustrates an interposer 2400 that includes one or more embodiments of the invention. The interposer 2400 is an intervening substrate used to bridge a first substrate 2402 to a second substrate 2404. The first substrate 2402 may be, for instance, an integrated circuit die that includes transistors, diodes, or other semiconductor based devices having source/drain recess etch stop layers and bottom wide-gap cap, as described herein. The second substrate 2404 may be, for instance, a memory module, a computer motherboard, or another integrated circuit die that includes transistors, diodes, or other semiconductor based devices having source/drain recess etch stop layers and bottom wide-gap cap, as described herein. Generally, the purpose of an interposer 2400 is to spread a connection to a wider pitch or to reroute a connection to a different connection. For example, an interposer 2400 may couple an integrated circuit die to a ball grid array (BGA) 2406 that can subsequently be coupled to the second substrate 2404. In some embodiments, the first and second substrates 2402/2404 are attached to opposing sides of the interposer 2400. In other embodiments, the first and second substrates 2402/2404 are attached to the same side of the interposer 2400. And in further embodiments, three or more substrates are interconnected by way of the interposer 2400.

The interposer 2400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 2408, vias 2410 and through-silicon vias (TSVs) 2412. The interposer 2400 may further include embedded devices 2414, including passive and active devices that include source/drain recess etch stop layers and bottom wide-gap cap as described herein. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 2400. In accordance with embodiments of the invention, apparatuses or processes disclosed herein may be used in the fabrication of interposer 2400.

Figure 25:
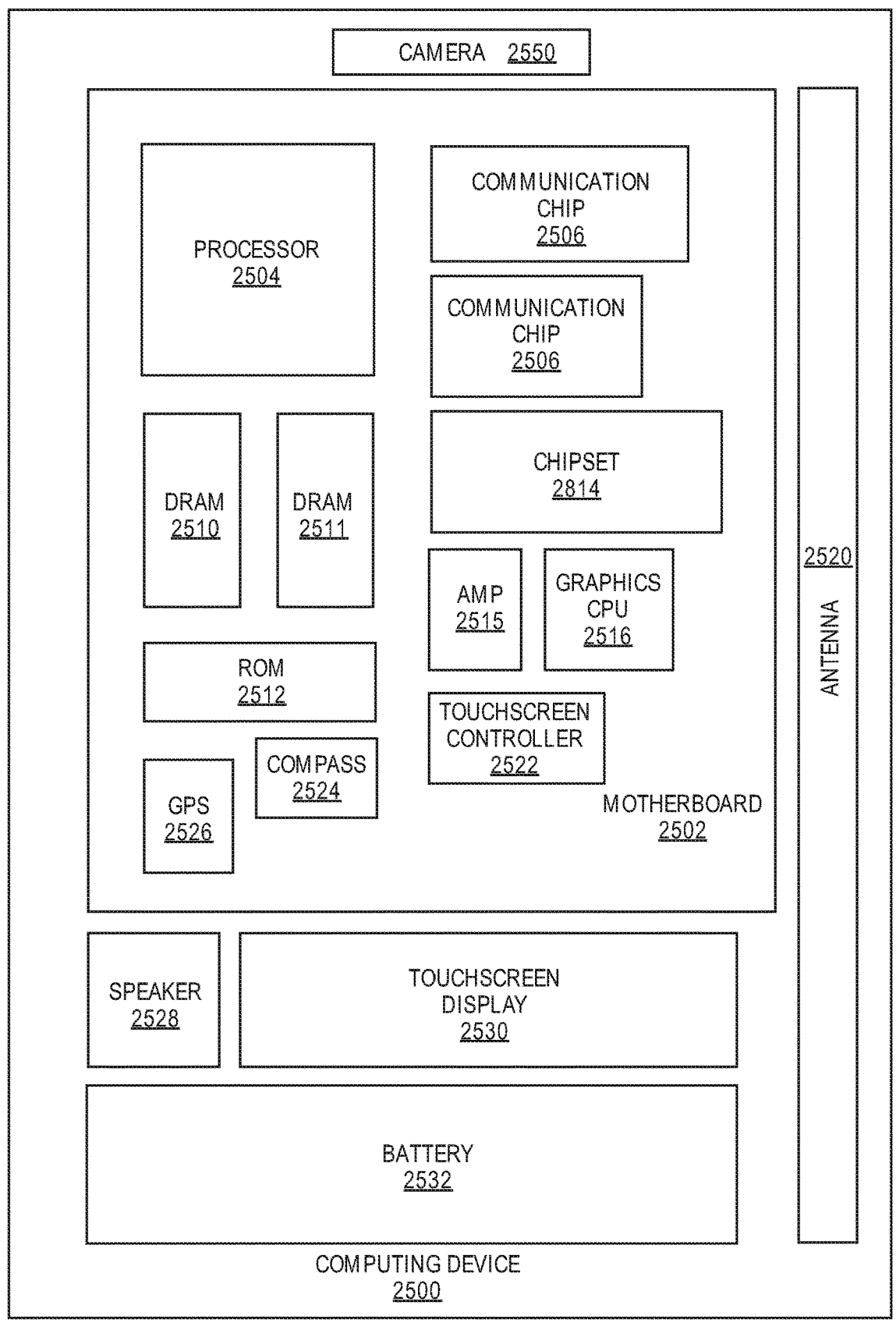
FIG. 25 illustrates a computing device in accordance with one embodiment of the invention.

FIG. 25 illustrates a computing device 2500 in accordance with one embodiment of the invention. The computing device 2500 may include a number of components. In one embodiment, these components are attached to one or more motherboards. In an alternate embodiment, these components are fabricated onto a single system-on-a-chip (SoC) die rather than a motherboard. The components in the computing device 2500 include, but are not limited to, an integrated circuit die 2502 and at least one communication chip 2508. In some implementations the communication chip 2508 is fabricated as part of the integrated circuit die 2502. The integrated circuit die 2502 may include a processor 2504 such as a central processing unit (CPU), an on-die memory 2506, often used as cache memory, that can be provided by technologies such as embedded DRAM (eDRAM) or spin-transfer torque memory (STTM or STTM-RAM).

Computing device 2500 may include other components that may or may not be physically and electrically coupled to the motherboard or fabricated within an SoC die. These other components include, but are not limited to, a volatile memory 2510 (e.g., DRAM), a non-volatile memory 2512 (e.g., ROM or flash memory), a graphics processing unit 2514 (GPU), a digital signal processor 2516 (DSP), a crypto processor 2542 (a specialized processor that executes cryptographic algorithms within hardware), a chipset 2520, an antenna 2522, a display or a touchscreen display 2524, a touchscreen display controller 2526, a battery 2528 or other power source, a global positioning system (GPS) device 2544, a power amplifier (PA), a compass, a motion coprocessor or sensors 2532 (that may include an accelerometer, a gyroscope, and a compass), a speaker 2534, a camera 2536, user input devices 2538 (such as a keyboard, mouse, stylus, and touchpad), and a mass storage device 2540 (such as hard disk drive, compact disk (CD), digital versatile disk (DVD), and so forth).

The communication chip 2508 enables wireless communications for the transfer of data to and from the computing device 2500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2500 may include a plurality of communication chips 2508. For instance, a first communication chip 2508 may be dedicated to shorter range wireless communications such as Wi-Fi and Bluetooth and a second communication chip 2508 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components (e.g., integrated circuit die 2502, communication chip 2508, GPU 2514, cryptoprocessor 2542, DSP 2516, chipset 2520), and other components may include one or more source/drain recess etch stop layers and bottom wide-gap cap formed in accordance with embodiments of the invention. In further embodiments, another component housed within the computing device 2500 may contain one or more source/drain recess etch stop layers and bottom wide-gap cap formed in accordance with embodiments of the invention.

In various embodiments, the computing device 2500 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 2500 may be any other electronic device that processes data.

The above description of illustrative implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In Example 1, an electronic device comprises a buffer layer on a substrate; a first III-V semiconductor layer on the buffer layer; a second III-V semiconductor layer comprising a channel portion and a source/drain portion on the first III-V semiconductor layer, wherein the first III-V semiconductor layer acts as an etch stop layer to etch a portion of the second III-V semiconductor layer to form the source/drain portion.

In Example 2, the subject matter of Example 1 can optionally include that the first III-V semiconductor layer has a bandgap that is greater than a bandgap of the second III-V semiconductor layer.

In Example 3, the subject matter of any of Examples 1-2 can optionally include that the first III-V semiconductor layer comprises a group V material that is different from a group V material of the second III-V semiconductor layer.

In Example 4, the subject matter of any of Examples 1-3 can optionally include that the first III-V semiconductor layer comprises indium phosphide, gallium phosphide, indium gallium phosphide, or any combination thereof.

In Example 5, the subject matter of any of Examples 1-4 can optionally include that the second III-V semiconductor layer comprises indium gallium arsenide, indium arsenide, indium antimonide, indium gallium antimonide, or any combination thereof.

In Example 6, the subject matter of any of Examples 1-5 can optionally include that the thickness of the first III-V semiconductor layer is from 2 nanometers to 10 nanometers.

In Example 7, the subject matter of any of Examples 1-8 can optionally include a gate dielectric on the channel portion; and a gate electrode on the gate dielectric.

In Example 8, the subject matter of any of Examples 1-7 can optionally include that the gate dielectric is on a portion of the first III-V semiconductor layer to form a gate all around device.

In Example 9, the subject matter of any of Examples 1-8 can optionally include that the gate dielectric wraps around the channel portion.

In Example 10, the subject matter of any of Examples 1-9 can optionally include a third III-V semiconductor layer between the gate dielectric and the channel portion.

In Example 11, the subject matter of any of Examples 1-10 can optionally include that the source/drain portion is an n-type semiconductor.

In Example 12, the subject matter of any of Examples 1-11 can optionally include that the source/drain portion is a p-type semiconductor.

In Example 13, the subject matter of any of Examples 1-12 can optionally include that a portion of the first III-V semiconductor layer is a part of the source/drain region.

In Example 14, the subject matter of any of Examples 1-13 can optionally include that the second III-V semiconductor layer on the first III-V semiconductor layer comprises a fin.

In Example 15, the subject matter of any of Examples 1-14 can optionally include that the first III-V semiconductor layer comprises a recess.

In Example 16, the subject matter of any of Examples 1-15 can optionally include that the buffer layer comprises a gallium arsenide layer.

In Example 17, an electronic device comprises a fin comprising a first III-V semiconductor layer on a substrate; a second III-V semiconductor layer on a first III-V semiconductor layer on a substrate, a gate dielectric on a first side of a channel portion of the second III-V semiconductor layer, wherein the first III-V semiconductor layer is between a second side of the channel portion and the gate dielectric, wherein the first III-V semiconductor layer has a bandgap that is greater than a bandgap of the second III-V semiconductor layer.

In Example 18, the subject matter of Example 17 can optionally include that an etching rate of the second III-V semiconductor layer is substantially greater than an etching rate of the first III-V semiconductor layer.

In Example 19, the subject matter of any of Examples 17-18 can optionally include a gate electrode on the gate dielectric.

In Example 20, the subject matter of any of Examples 17-19 can optionally include that the first semiconductor layer comprises a group V material that is different from a group V material of the second III-V semiconductor layer.

In Example 21, the subject matter of any of Examples 17-20 can optionally include that the first III-V semiconductor layer comprises indium phosphide, gallium phosphide, indium gallium phosphide, or any combination thereof.

In Example 22, the subject matter of any of Examples 17-21 can optionally include that the second III-V semiconductor layer comprises indium gallium arsenide, indium arsenide, indium antimonide, indium gallium antimonide, or any combination thereof.

In Example 23, the subject matter of any of Examples 17-22 can optionally include that the thickness of the first III-V semiconductor layer is from 2 nanometers to 10 nanometers.

In Example 24, the subject matter of any of Examples 17-23 can optionally include a third III-V semiconductor layer between the gate dielectric and the first side of the channel portion.

In Example 25, the subject matter of any of Examples 17-24 can optionally include that the second III-V semiconductor layer comprises a source/drain portion.

In Example 26, the subject matter of any of Examples 17-25 can optionally include that a portion of the first III-V semiconductor layer is a part of the source/drain region.

In Example 27, the subject matter of any of Examples 17-26 can optionally include that the first III-V semiconductor layer comprises a recess.

In Example 28, the subject matter of any of Examples 17-27 can optionally include that a buffer layer between the first III-V semiconductor layer and the substrate.

In Example 29, a data processing system comprises a chip including an electronic device comprising a buffer layer on a substrate; a first III-V semiconductor layer on the buffer layer; a second III-V semiconductor layer comprising a channel portion and a source/drain portion on the first III-V semiconductor layer, wherein the first III-V semiconductor layer acts as an etch stop layer to etch a portion of the second III-V semiconductor layer to form the source/drain portion.

In Example 30, the subject matter of any of Example 29 can optionally include that the first III-V semiconductor layer has a bandgap that is greater than a bandgap of the second III-V semiconductor layer.

In Example 31, the subject matter of any of Examples 29-30 can optionally include that the first III-V semiconductor layer comprises a group V material that is different from a group V material of the second III-V semiconductor layer.

In Example 32, the subject matter of any of Examples 29-31 can optionally include that the first III-V semiconductor layer comprises indium phosphide, gallium phosphide, indium gallium phosphide, or any combination thereof.

In Example 33, the subject matter of any of Examples 29-33 can optionally include that the second III-V semiconductor layer comprises indium gallium arsenide, indium arsenide, indium antimonide, indium gallium antimonide, or any combination thereof.

In Example 34, the subject matter of any of Examples 29-33 can optionally include that the thickness of the first III-V semiconductor layer is from 2 nanometers to 10 nanometers.

In Example 35, the subject matter of any of Examples 29-34 can optionally include that the electronic device further comprises a gate dielectric on the channel portion; and a gate electrode on the gate dielectric.

In Example 36, the subject matter of any of Examples 29-35 can optionally include that a portion of the first III-V semiconductor layer is a part of the source/drain region.

In Example 37, the subject matter of any of Examples 29-36 can optionally include that the second III-V semiconductor layer on the first III-V semiconductor layer comprises a fin.

In Example 38, the subject matter of any of Examples 29-37 can optionally include that the first semiconductor layer comprises a recess.

In Example 39, the subject matter of any of Examples 29-38 can optionally include that the buffer layer comprises a gallium arsenide layer.

In Example 40, a method to manufacture an electronic device comprises depositing a buffer layer on a substrate; depositing a first III-V semiconductor layer on the buffer layer; and depositing a second III-V semiconductor layer on the first III-V semiconductor layer, wherein the first III-V semiconductor layer acts as an etch stop layer to etch a portion of the second III-V semiconductor layer to form the source/drain portion.

In Example 41, the subject matter of Example 40 can optionally include that the first III-V semiconductor layer has a bandgap that is greater than a bandgap of the second III-V semiconductor layer.

In Example 42, the subject matter of any of Examples 40-41 can optionally include that the first III-V semiconductor layer comprises a group V material that is different from a group V material of the second III-V semiconductor layer.

In Example 43, the subject matter of any of Examples 40-42 can optionally include that the first III-V semiconductor layer comprises indium phosphide, gallium phosphide, indium gallium phosphide, or any combination thereof.

In Example 44, the subject matter of any of Examples 40-43 can optionally include that the second III-V semiconductor layer comprises indium gallium arsenide, indium arsenide, indium antimonide, indium gallium antimonide, or any combination thereof.

In Example 45, the subject matter of any of Examples 40-44 can optionally include that the thickness of the first semiconductor layer is from 2 nanometers to 10 nanometers.

In Example 46, the subject matter of any of Examples 40-45 can optionally include depositing a gate dielectric layer on a channel portion of the second III-V semiconductor layer; and depositing a gate electrode on the gate dielectric layer.

In Example 47, the subject matter of Example 46 can optionally include that the gate dielectric is on a portion of the first III-V semiconductor layer to form a gate all around device.

In Example 48, the subject matter of any of Example 46 can optionally include that the gate dielectric wraps around the channel portion.

In Example 49, the subject matter of Example 46 can optionally include depositing a third III-V semiconductor layer between the gate dielectric layer and the channel portion.

In Example 50, the subject matter of any of Examples 40-49 can optionally include that a portion of the first III-V semiconductor layer is a part of the source/drain region.

In Example 51, the subject matter of any of Examples 40-50 can optionally include that the second III-V semiconductor layer on the first III-V semiconductor layer comprises a fin.

In Example 52, the subject matter of any of Examples 40-51 can optionally include etching the second semiconductor layer to form a recess; and depositing a source/drain portion in the recess.

In Example 53, the subject matter of any of Examples 40-52 can optionally include that the buffer layer comprises a gallium arsenide layer.

In Example 54, a method to manufacture an electronic device comprises forming a fin comprising a first III-V semiconductor layer on a substrate; and a second III-V semiconductor layer on a first III-V semiconductor layer on a substrate, a gate dielectric on a first side of a channel portion of the second III-V semiconductor layer, wherein the first III-V semiconductor layer is between a second side of the channel portion and the gate dielectric, wherein the first III-V semiconductor layer has a bandgap that is greater than a bandgap of the second III-V semiconductor layer.

In Example 55, the subject matter of Example 54 can optionally include etching a portion of the second III-V semiconductor layer to expose a portion of the first III-V semiconductor layer, wherein the first III-V layer acts as an etch stop layer; and depositing a source/drain portion on the exposed portion of the first III-V semiconductor layer.

In Example 56, the subject matter of any of Examples 54-55 can optionally include forming a gate electrode on the gate dielectric.

In Example 57, the subject matter of any of Examples 54-56 can optionally include that the first III-V semiconductor layer comprises a group V material that is different from a group V material of the second HI-V semiconductor layer.

In Example 58, the subject matter of any of Examples 54-57 can optionally include that the first III-V semiconductor layer comprises indium phosphide, gallium phosphide, indium gallium phosphide, or any combination thereof.

In Example 59, the subject matter of any of Examples 54-58 can optionally include that the second III-V semiconductor layer comprises indium gallium arsenide, indium arsenide, indium antimonide, an indium gallium antimonide, or any combination thereof.

In Example 60, the subject matter of any of Examples 54-59 can optionally include that the thickness of the first III-V semiconductor layer is from 2 nanometers to 10 nanometers.

In Example 61, the subject matter of any of Examples 54-60 can optionally include forming a third III-V semiconductor layer between the channel portion and the first side of the channel portion.

In Example 62, the subject matter of any of Examples 54-61 can optionally include that the second III-V semiconductor layer comprises a source/drain portion.

In Example 63, the subject matter of any of Examples 54-62 can optionally include that a portion of the first III-V semiconductor layer is a part of the source/drain region.

In Example 64, the subject matter of any of Examples 54-63 can optionally include forming a recess in the first III-V semiconductor layer.

In Example 65, the subject matter of any of Examples 54-64 can optionally include depositing a buffer layer on the substrate.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An electronic device comprising:
   a buffer layer on a substrate, the buffer layer having an uppermost surface;
   a first III-V semiconductor layer on the buffer layer;
   a second III-V semiconductor layer comprising a channel portion on the first III-V semiconductor layer, wherein the first III-V semiconductor layer has a different composition than the second III-V semiconductor layer;
   a third semiconductor layer directly on the first III-V semiconductor layer and laterally adjacent the second III-V semiconductor layer, the third III-V semiconductor layer in a source/drain region, and the third semiconductor layer having a semiconductor material composition different than a semiconductor material composition of the second III-V semiconductor layer; and a gate dielectric on the channel portion; and a gate electrode on the gate dielectric, the gate electrode extending below the uppermost surface of the buffer layer.

2. The electronic device of claim 1, wherein the first III-V semiconductor layer has a bandgap that is greater than a bandgap of the second III-V semiconductor layer.

3. The electronic device of claim 1, wherein the first III-V semiconductor layer comprises a group V material that is different from a group V material of the second III-V semiconductor layer.

4. The electronic device of claim 1, wherein the first III-V semiconductor layer comprises indium phosphide, gallium phosphide, indium gallium phosphide, or any combination thereof.

5. The electronic device of claim 1, wherein the second III-V semiconductor layer comprises indium gallium arsenide, indium antimonide, indium gallium antimonide, or any combination thereof.

6. The electronic device of claim 1, wherein the second III-V semiconductor layer on the first III-V semiconductor layer comprises a fin.

7. A data processing system comprising:

a chip including an electronic device comprising a buffer layer on a substrate;

a first III-V semiconductor layer on the buffer layer;

a second III-V semiconductor layer comprising a channel portion on the first III-V semiconductor layer, wherein the first III-V semiconductor layer has a different composition than the second III-V semiconductor layer;

a third semiconductor layer directly on the first III-V semiconductor layer and laterally adjacent the second III-V semiconductor layer, the third III-V semiconductor layer in a source/drain region, and the third semiconductor layer having a semiconductor material composition different than a semiconductor material composition of the second III-V semiconductor layer; and a gate dielectric on the channel portion; and a gate electrode on the gate dielectric, the gate electrode extending below an uppermost surface of the buffer layer.

8. The data processing system of claim 7, wherein the first III-V semiconductor layer has a bandgap that is greater than a bandgap of the second III-V semiconductor layer.

9. The data processing system of claim 7, wherein the first III-V semiconductor layer comprises a group V material that is different from a group V material of the second III-V semiconductor layer.

10. The data processing system of claim 7, wherein the first III-V semiconductor layer comprises indium phosphide, gallium phosphide, indium gallium phosphide, or any combination thereof.

11. The data processing system of claim 7, wherein the second III-V semiconductor layer comprises indium gallium arsenide, indium arsenide, indium antimonide, indium gallium antimonide, or any combination thereof.

12. The data processing system of claim 7, wherein the second III-V semiconductor layer on the first III-V semiconductor layer comprises a fin.

13. An electronic device comprising:

a buffer layer on a substrate;

a first III-V semiconductor layer on the buffer layer;

a second III-V semiconductor layer comprising a channel portion on the first III-V semiconductor layer, wherein the first III-V semiconductor layer has a different composition than the second III-V semiconductor layer;

a third semiconductor layer directly on the first III-V semiconductor layer and laterally adjacent the second III-V semiconductor layer, the third III-V semiconductor layer in a source/drain region, the third semiconductor layer having a semiconductor material composition different than a semiconductor material composition of the second III-V semiconductor layer, and the third semiconductor layer having a dopant concentration different than a dopant concentration of the second III-V semiconductor layer; and a gate dielectric on the channel portion; and a gate electrode on the gate dielectric, the gate electrode extending below an uppermost surface of the buffer layer.

14. The electronic device of claim 13, wherein the first III-V semiconductor layer has a bandgap that is greater than a bandgap of the second III-V semiconductor layer.

15. The electronic device of claim 13, wherein the first III-V semiconductor layer comprises a group V material that is different from a group V material of the second III-V semiconductor layer.

16. The electronic device of claim 13, wherein the first III-V semiconductor layer comprises indium phosphide, gallium phosphide, indium gallium phosphide, or any combination thereof.

17. The electronic device of claim 13, wherein the second III-V semiconductor layer comprises indium gallium arsenide, indium antimonide, indium gallium antimonide, or any combination thereof.

* * * * *